United States Patent
Hsu et al.

(10) Patent No.: US 11,618,673 B2
(45) Date of Patent: Apr. 4, 2023

(54) TRANSFER SYSTEM FOR MICROELEMENTS

(71) Applicant: Xiamen San'An Optoelectronics Co., Ltd., Fujian (CN)

(72) Inventors: Chenke Hsu, Fujian (CN); Jiali Zhuo, Fujian (CN); Xiaojuan Shao, Fujian (CN); Jiansen Zheng, Fujian (CN); Xinghua Liang, Fujian (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 18 days.

(21) Appl. No.: 17/447,982

(22) Filed: Sep. 17, 2021

(65) Prior Publication Data

US 2022/0002146 A1 Jan. 6, 2022

Related U.S. Application Data

(60) Division of application No. 16/426,013, filed on May 30, 2019, now Pat. No. 11,142,452, which is a
(Continued)

(30) Foreign Application Priority Data

Dec. 12, 2016 (CN) .......................... 201611137362.0

(51) Int. Cl.
*H01L 21/67* (2006.01)
*B81C 1/00* (2006.01)
(Continued)

(52) U.S. Cl.
CPC ...... *B81C 1/00015* (2013.01); *B81C 1/00349* (2013.01); *B81C 3/008* (2013.01);
(Continued)

(58) Field of Classification Search
CPC . B81C 1/00015; B81C 1/00349; B81C 3/008; B81C 99/002; G01R 31/00;
(Continued)

(56) References Cited

U.S. PATENT DOCUMENTS

2003/0211652 A1 11/2003 Summers
2018/0151804 A1 5/2018 Gholamreza et al.

FOREIGN PATENT DOCUMENTS

CN 101283635 A 10/2008
CN 102214549 A 10/2011
(Continued)

OTHER PUBLICATIONS

Search Report issued to PCT application No. PCT/CN2017/097848 by the CNIPA dated Nov. 27, 2017.
(Continued)

*Primary Examiner* — Elias Ullah
(74) *Attorney, Agent, or Firm* — Thomas | Horstemeyer, LLP

(57) ABSTRACT

A transfer system for transferring multiple microelements to a receiving substrate includes a main pick-up device, a testing device, and first and second carrier plates. The testing device includes a testing platform, a testing circuit, and multiple testing electrodes electrically connected to the testing circuit. The main pick-up device is operable to releasably pick up the microelements from the first carrier plate and position the microelements on the testing electrodes. The testing device is operable to test the microelements to distinguish unqualified ones of the microelements from qualified ones. The main pick-up device is operable to release the qualified ones of the microelements to the receiving substrate.

20 Claims, 22 Drawing Sheets

Related U.S. Application Data continuation-in-part of application No. PCT/CN2017/097848, filed on Aug. 17, 2017.

(51) Int. Cl.
| | |
|---|---|
| *B81C 3/00* | (2006.01) |
| *H01L 21/677* | (2006.01) |
| *H01L 21/683* | (2006.01) |
| *H01L 21/66* | (2006.01) |
| *G01R 31/00* | (2006.01) |

(52) U.S. Cl.
CPC ........ *G01R 31/00* (2013.01); *H01L 21/67259* (2013.01); *H01L 21/67763* (2013.01); *H01L 21/6838* (2013.01); *H01L 22/34* (2013.01); *H01L 22/12* (2013.01); *H01L 22/14* (2013.01)

(58) Field of Classification Search
CPC ......... H01L 21/67259; H01L 21/67763; H01L 21/6838; H01L 22/34; H01L 22/12; H01L 22/14; H01L 2221/68322; H01L 21/6835; H01L 22/20; H01L 2221/68354; H01L 2221/68368; H01L 2221/68381
See application file for complete search history.

(56) References Cited

FOREIGN PATENT DOCUMENTS

| | | |
|---|---|---|
| CN | 103508185 A | 1/2014 |
| CN | 104801496 A | 7/2015 |
| CN | 106057723 A | 10/2016 |
| CN | 106601657 A | 4/2017 |
| TW | M503570 U | 6/2015 |
| TW | 201530681 A | 8/2015 |

OTHER PUBLICATIONS

Search Report appended to an Office Action issued to Taiwanese counterpart application No. 106142112 by the TIPO dated Sep. 5, 2018, with an English translation thereof.

Search Report appended to an Office Action, which was issued to Chinese counterpart application No. 201611137362.0 by the CNIPA dated Nov. 21, 2018, with an English translation thereof.

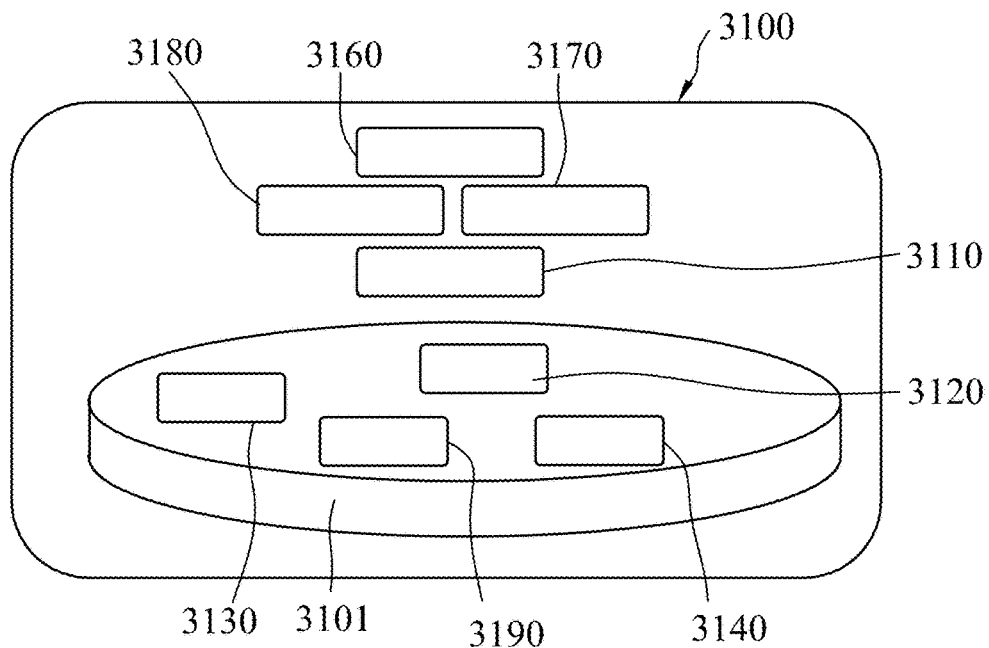

FIG.26

| Providing a transfer system including a main pick-up device, a testing device and a UV lighting device | S310 |
| Coating a UV adhesive on a surface of the main pick-up device to form a detachable layer, and operating the main pick-up device to pick up a plurality of microelements through the detachable layer | S320 |
| Operating the main pick-up device to connect the microelements to the testing device | S330 |
| Operating the testing device to test the microelements to distinguish the unqualified microelements from the qualified microelements | S340 |
| Operating the main pick-up device to release the qualified microelements to a receiving substrate | S350 |

FIG.27

Operating the UV lighting device to solidify a portion of the detachable layer corresponding to the unqualified microelements into at least one solidified region — S451

Aligning the main pick-up device with the receiving substrate — S452

Operating the hydrolysis device to decompose the detachable layer other than the solidified region, at room temperature, to release the qualified microelements from the main pick-up device to the receiving substrate — S453

Operating the hydrolysis device to decompose the solidified region of the detachable layer, at a higher temperature, to release the unqualified microelements from the main pick-up device — S454

FIG.37

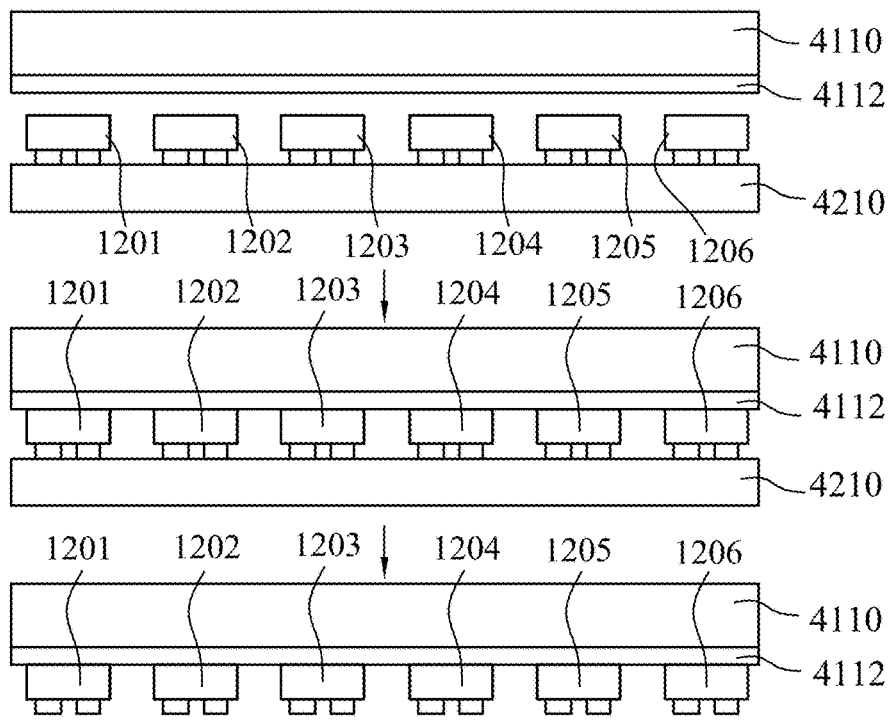

FIG.38

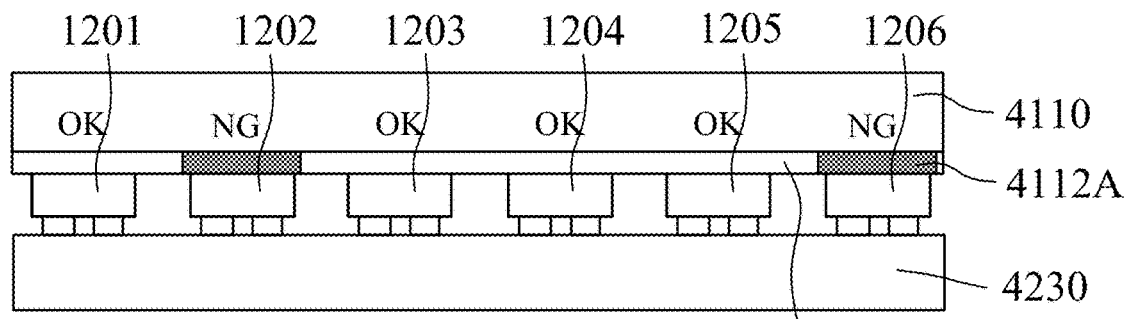
FIG.42
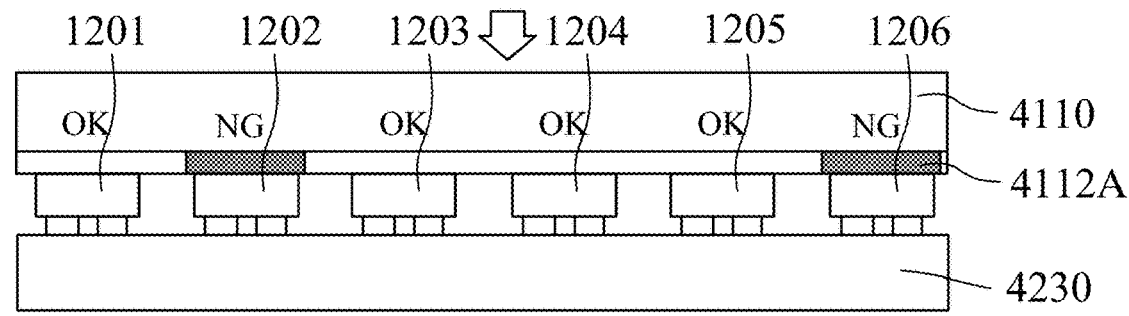
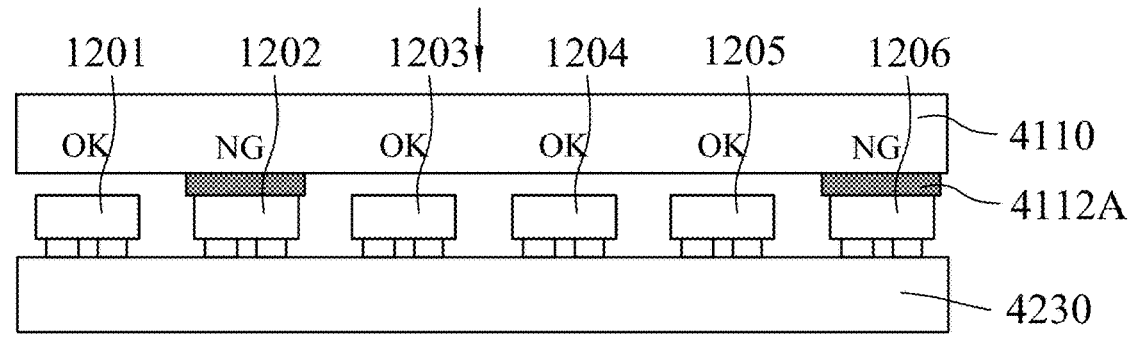
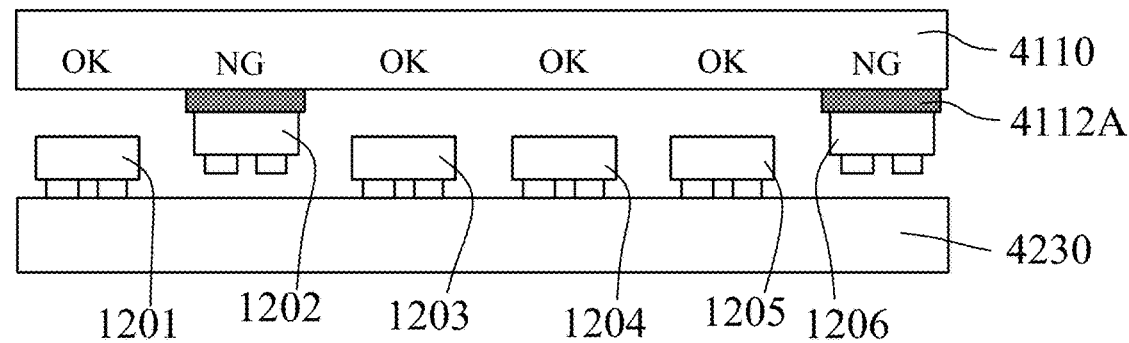
FIG.43

TRANSFER SYSTEM FOR MICROELEMENTS

CROSS-REFERENCE TO RELATED APPLICATION

This application is a divisional application of U.S. patent application Ser. No. 16/426,013 filed on May 30, 2019, which is a bypass continuation-in-part of International Application No. PCT/CN2017/097848 filed on Aug. 17, 2017, which claims priority of Chinese Patent Application No. 201611137362.0, filed on Dec. 12, 2016. The entire content of each of the U.S., International and Chinese patent applications is incorporated herein by reference.

FIELD

The disclosure relates to a transfer system, a transfer method, and applications thereof, and more particular to a transfer system and a transfer method for microelements, a manufacturing method for a microelement device and a microelement device made therefrom, and an electronic apparatus including the microelement device.

BACKGROUND

Microelement technology pertains to the making of a microelement array with high density of microelements. One of the promising applications of the microelement technology would be micro LED application, which may be used in making display devices, such as LCD, OLED display, etc., with superior brightness and resolution.

During application of the microelement technology, the microelements are first formed on a donor substrate, followed by being transferred to a receiving substrate, such as a display screen. Conventionally, wafer bonding technique is used for directly transferring the microelements from a carrying substrate to the receiving substrate. Alternatively, an indirect transferring method may be employed, including transferring the microelements from the donor substrate to the carrying substrate, followed by bonding the microelements to the receiving substrate and subsequently removing the carrying substrate.

However, the abovementioned conventional methods include unclassified transfer of the microelements, meaning both qualified and disqualified microelements are transferred to the receiving substrate.

SUMMARY

Therefore, a first aspect of the disclosure is to provide a transfer system for transferring a plurality of microelements to a receiving substrate.

The transfer system includes a main pick-up device, a testing device, a first carrier plate and a second carrier plate.

The testing device includes a testing platform, a testing circuit mounted to the testing platform, and a plurality of testing electrodes mounted to the testing platform and electrically connected to the testing circuit. The first carrier plate is configured for releasably holding the microelements. The second carrier plate is configured for releasably holding the receiving substrate.

The main pick-up device is operable to releasably pickup the microelements from the first carrier plate and correspondingly position the microelements on the testing electrodes of the testing device.

The testing device is operable to test the microelements positioned thereon to distinguish unqualified ones of the microelements from qualified ones of the microelements.

The main pick-up device is operable to release the qualified ones of the microelements to the receiving substrate.

A second aspect of the present disclosure is to provide a transfer method for microelements.

The method includes:

a providing step of providing a transfer system, the transfer system including a main pick-up device for picking up the microelements, and a testing device, the testing device including a testing platform, a testing circuit mounted to the testing platform, and a plurality of testing electrodes mounted to the testing platform and electrically connected to the testing circuit;

a pick-up step of operating the main pick-up device to pick up the microelements from a carrying substrate;

a connecting step of operating the main pick-up device to connect the microelements to the testing electrodes of the testing device;

a testing step of applying a testing voltage to the testing circuit to test the microelements and to distinguish unqualified ones of the microelements from qualified ones of the microelements; and a transferring step of operating the main pick-up device to release the qualified ones of the microelements to a receiving substrate.

According to other aspects of the present disclosure, a manufacturing method for a microelement device includes the above transfer method, and a microelement device made from the manufacturing method and an electronic apparatus includes the microelement device as made are also provided.

BRIEF DESCRIPTION OF THE DRAWINGS

Other features and advantages of the disclosure will become apparent in the following detailed description of the embodiments with reference to the accompanying drawings, of which:

FIG. 26 is a fourth embodiment of the transfer system according to the present disclosure;

FIG. 27 is a flow chart of a third embodiment of the transfer method, which utilizes the transfer system of FIG. 26;

FIG. 37 is a flow chart of four sub-steps of the fourth embodiment of the transfer method; and FIGS. 38 to 44 show different steps of the fourth embodiment of the transfer method.

DETAILED DESCRIPTION

Figure 1:
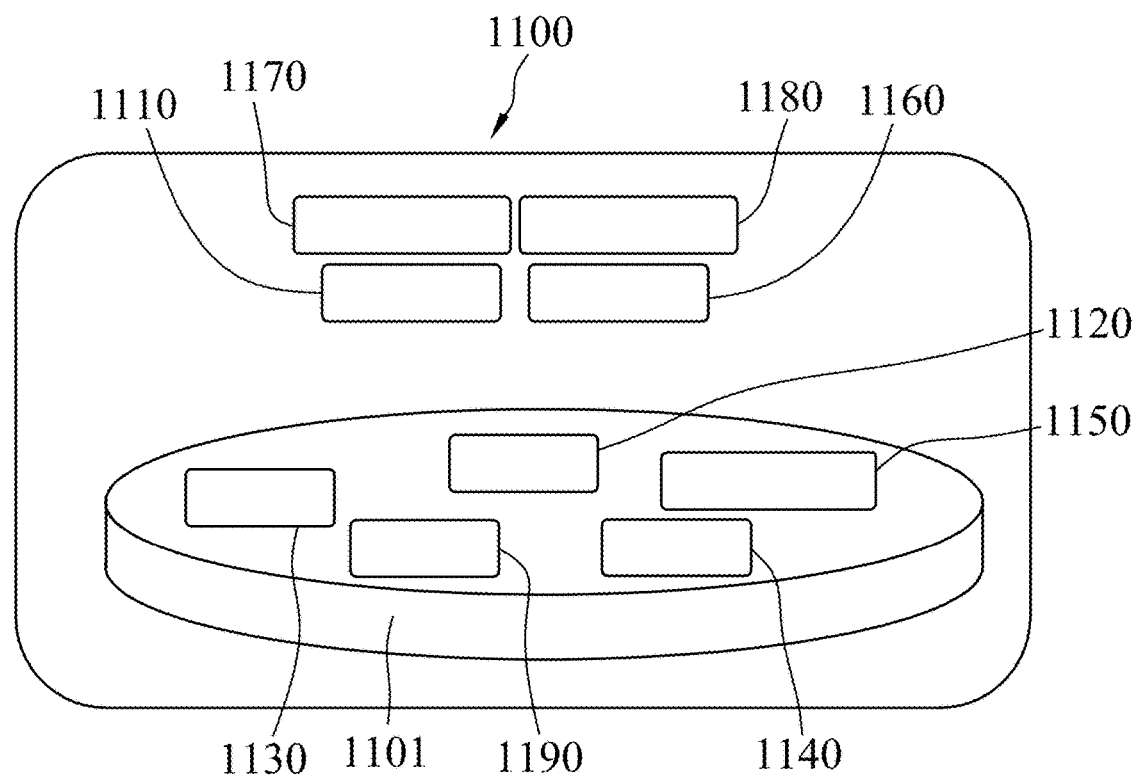
FIG. 1 is a schematic view of a first embodiment of a transfer system according to the present disclosure.

According to the present disclosure, a transfer system for transferring a plurality of microelements and a transfer method for microelements using the transfer system are provided. The microelements may be micro LEDs, diodes, transistors, integrated circuits, etc. and be arranged in an array. Each of the microelements may have a size that ranges from 1 μm to 5000 μm and that may be changed to be greater or smaller according to practical requirements.

The transfer system includes a main pick-up device including a plurality of pick-up units for releasably picking up the microelements. The pick-up units may be arranged in an array, and size of each of the pick-up units (e.g., length or width) may range from 1 μm to 5000 μm. For example, the size of each of the pick-up units may range from 10 μm to 100 μm or 100 μm to 500 μm or 1000 μm to 5000 μm. The transfer system further includes a testing device that includes a testing circuit and a testing platform. There are a plurality of testing electrodes mounted to the testing platform. The main pick-up device is operable to releasably pick up the microelements to correspondingly position the microelements on the testing electrodes. The testing device is operable to test the microelements positioned thereon. For example, by applying a voltage to the testing circuit, the photoelectric property of the microelements are determinable through the testing electrodes electrically connected to the testing circuit, thereby distinguishing unqualified ones of the microelements from qualified ones of the microelements. It should be noted that the qualified ones of the microelements are the microelements satisfying a predetermined standard according to practical requirements. Since the predetermined standard is selectable by one skilled in the art based on the actual application and is not one of the essential features of the present disclosure, the details thereof are omitted herein. When an existence of the unqualified ones of the microelements is determined, a defect mapping indicative of the unqualified ones of the microelements is produced, and the transfer system is capable of removing the unqualified microelements from subsequent manufacturing process based on the defective mapping.

The transfer system may further include an inverse pick-up device that is operable to releasably pick up the unqualified microelements from the main pick-up device. Then, the main pick-up device is operable to release the remaining microelements (i.e., the qualified ones of the microelements) to a receiving substrate. The main pick-up device may pick up the microelements through exertion of an attraction force, such as an electrostatic force, a van der Waals force, a vacuum suction force, an electromagnetic force, an adhesive force, etc. The inverse pick-up device exerts an attraction force to the microelements that is greater than the attraction force exerted to the microelements by the main pick-up device so as to ensure that the unqualified ones of the microelements are removed from the main pick-up device.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of the aforesaid transfer system according to the present disclosure is illustrated and indicated by a reference numeral of 1100. The transfer system 1100 is used for transferring the microelements to the receiving substrate. The transfer system 1100 includes a support platform 1101, the main pick-up device indicated by a reference numeral 1110, the testing device indicated by a reference numeral of 1120, a first carrier plate 1130, a second carrier plate 1140, the inverse pick-up device indicated by a reference numeral of 1150, a recycling device 1160, an alignment device 1170, an optical testing device 1180 and a cleaning device 1190.

The main pick-up device 1110 is light-transmissible in this embodiment, and is operable to pick up or release the microelements in a massively transferring manner. The alignment device 1170 is located above the main pick-up device 1110 for positional adjustment of the main pick-up device 1110. In this embodiment, the testing device 1120, the first carrier plate 1130, the second carrier plate 1140 and the inverse pick-up device 1150 are separately disposed on the support platform 1101. The main pick-up device 1110 is disposed above the testing device 1120, the first carrier plate 1130, the second carrier plate 1140 and the inverse pick-up device 1150 oppositely of the support platform 1101. The first carrier plate 1130 is configured for releasably holding the microelements, and the second carrier plate 1140 is configured for releasably holding the receiving substrate. During the transfer operation of the transfer system 1100, the main pick-up device 1110 is first operated to be located above the first carrier plate 1130 and to pick up the microelements from the first carrier plate 1130. Then, the main pick-up device 1110 positions the microelements on the testing device 1120, and the testing device 1120 is operated to test the microelements positioned thereon to distinguish unqualified ones of the microelements from qualified ones of the microelements. Afterwards, the main pick-up device 1110 is operated to be located above the inverse pick-up device 1150, and the inverse pick-up device 1150 is operated to releasably pick up the unqualified microelements from the main pick-up device 1110. Then, the main pick-up device 1110 is operated to be located above the second carrier plate 1140 and to release the qualified microelements to the receiving substrate held by the second carrier plate 1140 to achieve both abundant transfer and quality control of the microelements.

In order to achieve positioning of the main pick-up device 1110 relative to the first carrier plate 1130, the second carrier plate 1140, the inverse pick-up device 1150 and the cleaning device 1190, the main pick-up device 1110 is movable horizontally and vertically, or the first carrier plate 1130, the second carrier plate 1140, the inverse pick-up device 1150 and the cleaning device 1190 are movable horizontally and vertically. In this embodiment, the main pick-up device 1110 is configured to be immobile horizontally, and the support platform 1101 is configured to be horizontally movable relative to the main pick-up device 1110, such that the first carrier plate 1130, the second carrier plate 1140, the inverse pick-up device 1150 and the cleaning device 1190 carried by the support platform 1101 are horizontally movable relative to the main pick-up device 1110. In certain embodiments, the support platform 1101 may be rotatable or reciprocally movable in the horizontal direction. In this embodiment, the support platform 1101 is a rotatable platform. The transfer system 1100 may be further provided with a lifting mechanism to vertically move the main pick-up device 1110 at one predetermined horizontal position, and to separately or simultaneously vertically move the support platform 1101.

Figure 2:
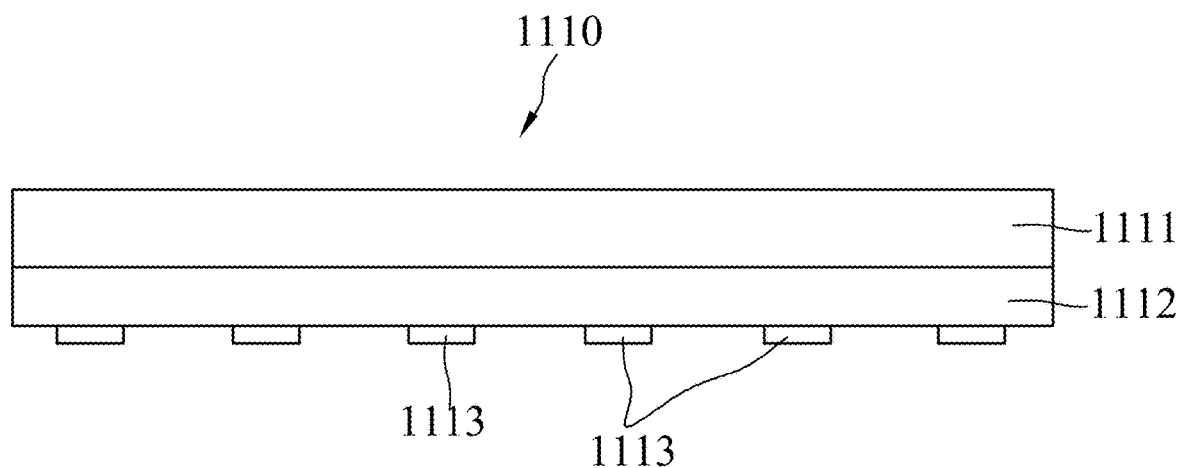
FIG. 2 is a schematic view of a main pick-up device of the first embodiment of the transfer system.

Referring further to FIG. 2, the pick-up units of the main pick-up device 1110 for releasably picking up the microelements, each of which is indicated by the reference numeral 1113 and has the size (e.g., length or width) ranging from 1 μm to 5000 μm, is capable of exerting the van der Waals force or the adhesive force to pick up a corresponding one of the microelements. In this embodiment, the light-transmissible main pick-up device 1110 includes a light-transmissible substrate 1111 and an elastic layer 1112 connected to the light-transmissible substrate 1111. The pick-up units 1113 are connected to the elastic layer 1112 opposite to the light-transmissible substrate 1111. In this embodiment, the elastic layer 1112 is made of polydimethylsiloxane (PDMS).

In certain embodiments, the pick-up units 1113 of the main pick-up device 1110 are made to have gecko-mimicking structures with a surface formed with nano-scaled protrusions having a density ranging from $1 \times 10^5$ to $6 \times 10^8$ per square centimeter. When the nano-scaled protrusions touch the microelements, the microelements are adhered to the nano-scaled protrusions through the van der Waals force. The nano-scaled protrusion may be hydrophobic to minimize the possibility of liquid entering the space among the nano-scaled protrusions due to capillary action. The space among the nano-scaled protrusions is therefore prevented from being increased by the liquid, and a sufficient van der Waals force among the nano-scaled protrusions and the microelements is ensured.

In certain embodiments, the main pick-up device 1110 may include a releasable adhesive layer for picking up the microelements. The releasable adhesive layer may be UV release tape, thermal release tape, water release tape etc.

Figure 3:
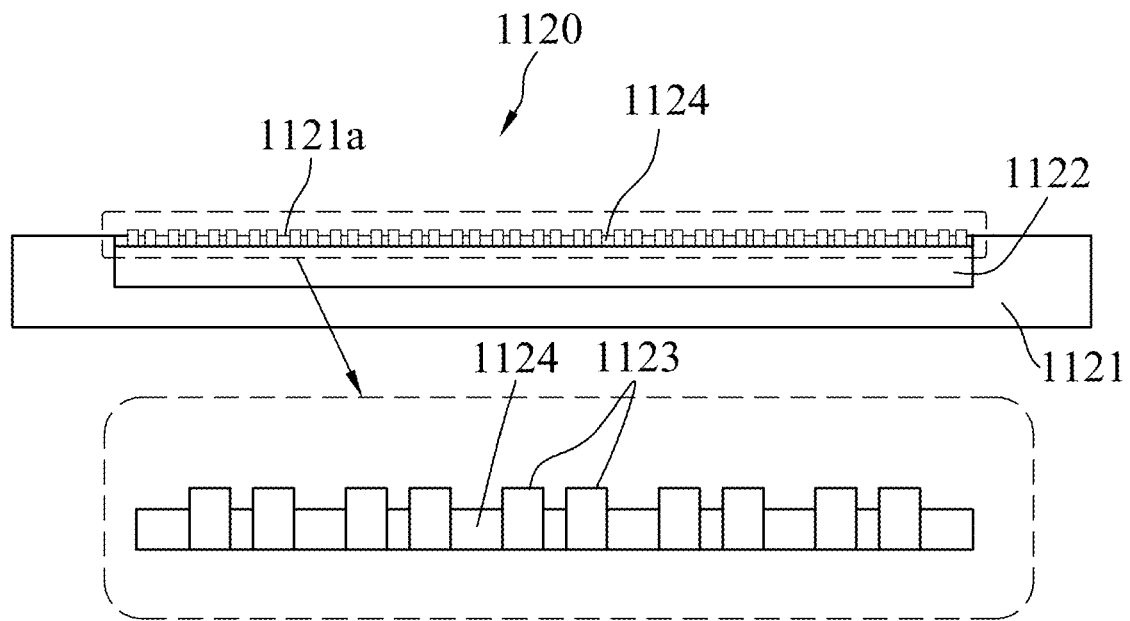
FIG. 3 is a schematic view of a testing device of the first embodiment of the transfer system.

Referring to FIG. 3, in the testing device 1120, the testing platform is indicated by the reference numeral of 1121, the testing circuit is indicated by the reference numeral 1122, and each of the testing electrodes is indicated by the reference numeral of 1123. The testing electrodes 1123 electrically connected to the testing circuit 1122 are mounted to a platform surface 1121a of the testing platform 1121. The testing circuit 1122 may include one or more integrated circuit, such as a MOS circuit, a CMOS circuit, a 3D-IC circuit, etc. In this embodiment, the testing circuit 1122 is the CMOS circuit having a plurality of sub-circuits.

In this embodiment, the testing device 1120 further includes an electrode plate 1124 on which the testing electrodes 1123 are disposed. The electrode plate 1124 is detachably mounted to the platform surface 1121a of the testing platform 1121 to achieve electrical connection between the testing electrodes 1123 and the testing circuit 1122. The testing electrodes 1123 may be arranged in arrays, and a spacing between two adjacent ones of the arrays of the testing electrodes 1123 is variable. For example, the spacing may be an integral multiple (e.g., one time, three times, thirty times, etc.) of a distance between two adjacent ones of the sub-circuits. The dimension of the electrode plate 1124 may be changed according to the number and arrangement of the microelements.

In this embodiment, the electrode plate 1124 is a silicon substrate and is formed with a plurality of micro through holes for respectively receiving the testing electrodes 1123 to achieve the electrical connection between the testing electrodes 1123 and the testing circuit 1122 by way of, for example, through-silicon via (TSV) technology. The testing electrodes 1123 may be formed into a micro bump array or a micro metal tube array (e.g., a copper nano tube array). Each of the testing electrodes 1123 may have a size ranging from 1 μm to 1000 μm. In certain embodiments, each of the testing electrodes 1123 may have a size ranging from 1 μm to 100 μm. In certain embodiments, each of the testing electrodes 1123 may have a size ranging from 1 μm to 50 μm. The pitch between adjacent two of the testing electrodes 1123 may range from 1 μm to 100 μm. In certain embodiments, each of the testing electrodes 1123 may have a size ranging from 5 μm to 20 μm, and the pitch between the adjacent two of the testing electrodes 1123 is 10 μm.

Figure 4:
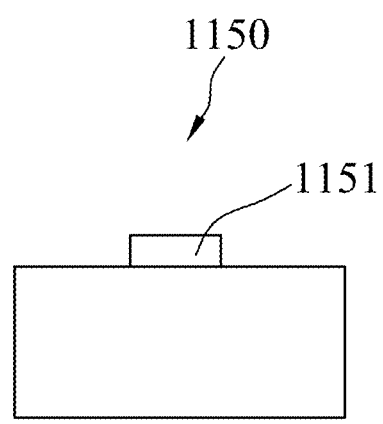
FIG. 4 is a schematic view of an inverse pick-up device of the first embodiment of the transfer system.

Referring to FIGS. 1 and 4, the inverse pick-up device 1150, for releasably picking up the unqualified microelements from the main pick-up device 1110 and exerting the attraction force greater than that exerted by the main pick-up device 1110 to the unqualified microelements to ensure the removal of the unqualified microelements from the main pick-up device 1110, includes at least one pick-up head 1151 for picking up the microelements with the attraction force of the electrostatic force, the van der Waals force, the vacuum suction force, the electromagnetic force, etc. In certain embodiments, the pick-up head 1151 may be connected to a robotic arm (not shown) to position the pick-up head 1151 relative to the unqualified microelements for expediting pick up of the same. In certain embodiments, the inverse pick-up device 1150 may include a plurality of the pick-up heads 1151 (only one is shown in FIG. 4) that are arranged into an array, and a micro switch array (not shown) for respectively controlling the pick-up heads 1151. Hence, the array of the pick-up heads 1151 is controllable to pick up all of the unqualified microelements at a time.

Referring back to FIG. 1, both the first carrier plate 1130 for releasably holding the microelements and the second carrier plate 1140 for releasably holding the receiving substrate may be chuck plates. In this embodiment, an optical device is provided to be disposed above the light-transmissible main pick-up device 1110. The optical device may include the optical testing device 1180, the alignment device 1170, or the combinations thereof. In this embodiment, the optical device includes both the optical testing device 1180 and the alignment device 1170. In this embodiment, the alignment device 1170 includes a charge-coupled device (not shown) for aligning the main pick-up device 1110 with the other devices, including the testing device 1120, the first carrier plate 1130, the second carrier plate 1140, the inverse pick-up device 1150 and the cleaning device 1190. The optical testing device 1180 is configured for determining optical property of the microelements. For example, when the microelements are light-emitting diodes, the optical testing device 1180 may be used for testing the optical parameters of the microelements, such as the light spectrum, the wavelength, the brightness, etc. The optical testing device 1180 may include a detector, a spectroscope, an integrating sphere, etc. In this embodiment, the optical testing device 1180 includes the spectroscope. In other embodiments, the optical device may be omitted.

The cleaning device 1190 is configured to clean the surface of the main pick-up device 1110 in contact with the microelements. In this embodiment, the cleaning device 1190 includes an adhesive layer for contacting the surface of the main pick-up device 1110 and removing contaminants, such as stains, dust, etc., therefrom.

Referring back to FIGS. 1 and 4, the recycling device 1160 is used for recycling the unqualified microelements. In practice, for the microelements having the size ranging from 1 μm to 200 μm, especially smaller than 100 μm, it is quite difficult to remove the unqualified ones of the microelements from the pick-up head 1151 of the inverse pick-up device 1150. In this embodiment, the recycling device 1160 has an adhesive surface 1160a (see FIG. 14) configured for picking up the unqualified the microelements from the pick-up head 1151 of the inverse pick-up device 1150. Hence, the removal of the unqualified microelements from the inverse pick-up device 1150 may be facilitated through direct adhesion of the unqualified the microelements to the adhesive surface 1160a. In this embodiment, the recycling device 1160 is disposed alongside the main pick-up device 1110 and is located above the support platform 1101 so as to avoid obstructing the pick-up head 1151 of the inverse pick-up device 1150 to pick up the unqualified microelements.

Referring back to FIGS. 1 to 3, the main pick-up device 1110, the testing device 1120 and the inverse pick-up device 1150 of the main pick-up device 1110 allow the main pick-up device 1110 to have device transfer, testing and selective picking functions. In detail, massive picking-up of the microelements can be achieved by the main pick-up device 1110, the defect pattern indicative of the unqualified microelements can be produced through testing of the microelements by the testing device 1120, and the removal of the unqualified microelements from the main pick-up device 1110 can be achieved by the inverse pick-up device 1150. Finally, only the qualified ones of the microelements will be transferred to the receiving substrate by the main pick-up device 1110.

The horizontally movable support platform 1101 carries the testing device 1120, the first carrier plate 1130, the second carrier plate 1140 and the inverse pick-up device 1150 to move relative to the main pick-up device 1110 so that these devices are able to be respectively aligned with the main pick-ups device 1110. Alternatively, the main pick-up device 1110 may be movable to be respectively aligned with the testing device 1120, the first carrier plate 1130, the second carrier plate 1140 and the inverse pick-up device 1150.

Since the main pick-up device 1110 in this embodiment is made to be light-transmissible, determination of the optical properties of the microelements and picking-up of the microelements can be simultaneously and respectively carried out by the optical device and the main pick-up device 1110, without separating the microelements from the main pick-up device 1110.

The detachable electrode plate 1124 facilitates formation of the micro bump array or the micro metal tube array for testing the microelements. Different types of the electrode plate 1124 can be used according to the size of the microelements and the spacing between the two adjacent ones of the arrays, improving the adaptability of the testing device 1120.

Figure 5:
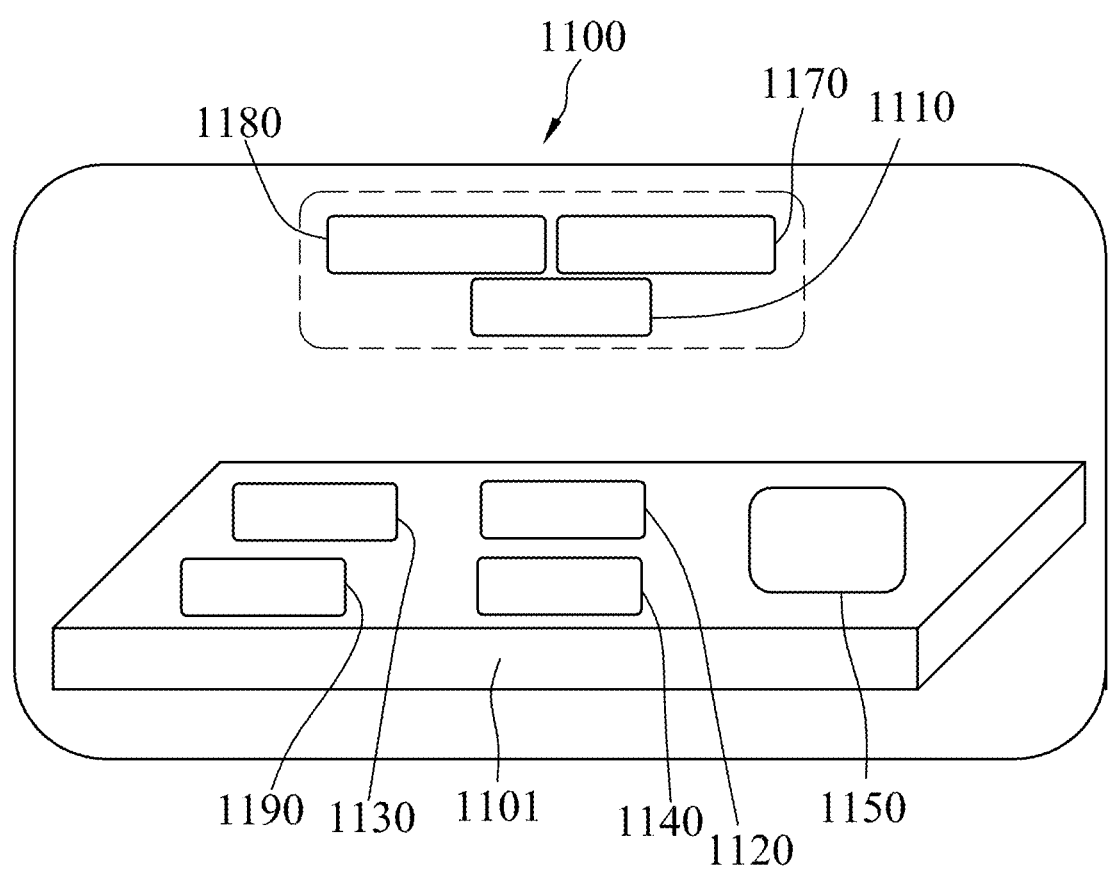
FIG. 5 is a schematic view of a second embodiment of the transfer system according to the present disclosure.

Referring to FIG. 5, a second embodiment of the transfer system 1100 according to the present disclosure has a structure modified from that of the first embodiment. In the second embodiment, the support platform 1101 is immobile, and the main pick-up device 1110 is movable relative to the support platform 1101. The optical device, including the alignment device 1170 and the optical testing device 1180, is co-movable with the main pick-up device 1110. For example, the main pick-up device 1110, the alignment device 1170 and the optical testing device 1180 may be separately mounted to a movable device to be movable simultaneously. Alternatively, the alignment device 1170 and the optical testing device 1180 may both be directly mounted to the main pick-up device 1110 to be simultaneously movable with the main pick-up device 1110.

Referring to FIGS. 2 and 5, in the second embodiment, the pick-up units 1113 are movable relative to the support platform 1101, and other parts of the main pick-up device 1110 may either be movable or immobile. A robotic arm (not shown) may be used to move the pick-up units 1113.

Figure 6:
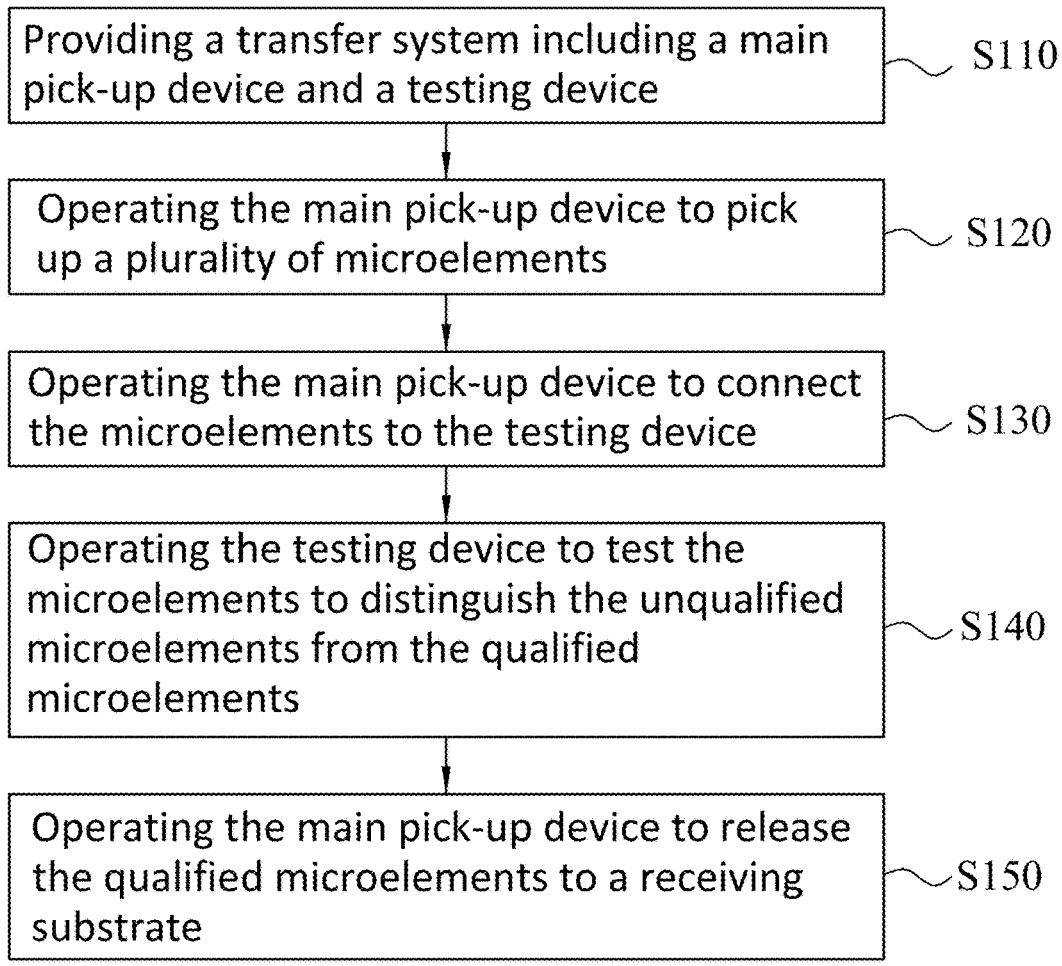
FIG. 6 is a flow chart of a first embodiment of a transfer method according to the present disclosure, which utilizes the transfer system of FIG. 1.
Figure 8:
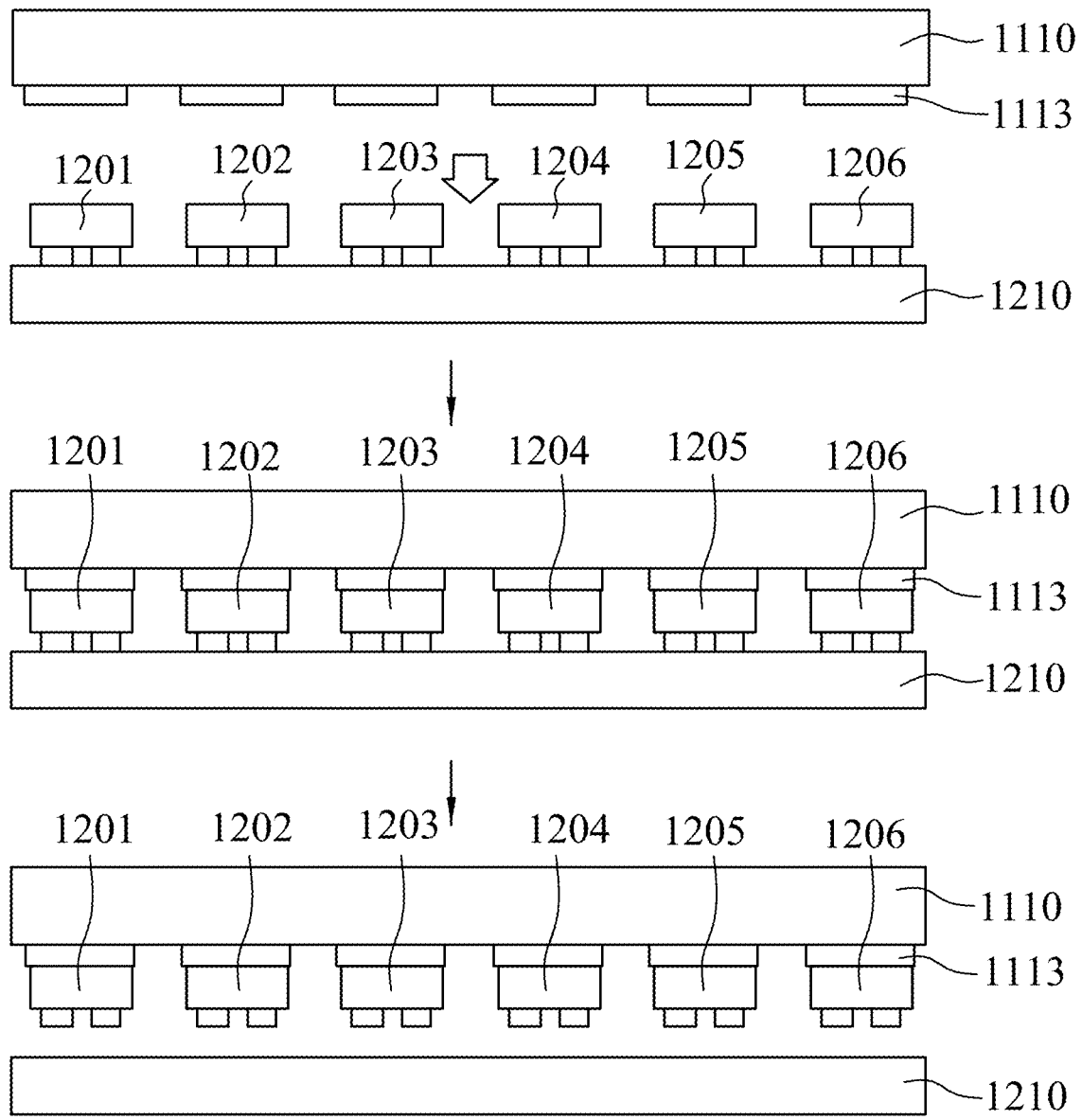
FIGS. 8 to 10 show different steps of the first embodiment of the transfer method.

Referring to FIGS. 1, 6 and 8, a first embodiment of a transfer method for microelements using the first embodiment of the transfer system 1100 is provided. The method includes steps S110 to S150.

In step S110, the transfer system 1100 is provided. The to-be-transferred microelements are connected to the carrying substrate indicated by a reference numeral of 1210 (see FIG. 8), which is disposed on the first carrier plate 1130. The receiving substrate indicated by a reference numeral of 1230 (see FIG. 15) is disposed on the second carrier plate 1140. The microelements may be directly formed on the carrying substrate 1210 using thin film deposition technique, where the carrying substrate 1210 serves as a growth substrate. Alternatively, the carrying substrate 1210 may be a support substrate and carry the microelements transferred from other substrates. The carrying substrate 1210 may be made of glass, silicon, polycarbonate (PC), acrylonitrile butadiene styrene (ABS), or combinations thereof. In certain embodiments, the microelements may be light-emitting diodes each having a thickness ranging from 0.5 μm to 100 μm and each having a shape of cylinder that has a diameter ranging from 0.5 μm to 500 μm. Alternatively, the microelements may have a shape of a triangular prism, a cube, a rectangle, a hexagonal prism, an octagonal prism, etc. The receiving substrate 1230 may be an automotive glass, a plate glass, a flexible film having circuit, a display backplane, a solar panel glass, a metal substrate, a polymer substrate, a polymer composite substrate, a glass fiber substrate, etc. The support platform 1101 is movable to align the testing device 1120, the first carrier 1130, the second carrier plate 1140, the inverse pick-up device 1150 or the cleaning device 1190 with the main pick-up device 1110.

In step S120, the first carrier plate 1130 is moved to be located below the main pick-up device 1110 and is aligned with the main pick-up device 1110. Then, the main pick-up device 1110 is operated to bring the pick-up units 1113 into contact with the microelements (1201 to 1206) to pick up the same. It should be noted that although only six microelements are shown in FIG. 8. In practice, the number of the microelements may be more than ten thousand, or even more than ten million.

Figure 9:
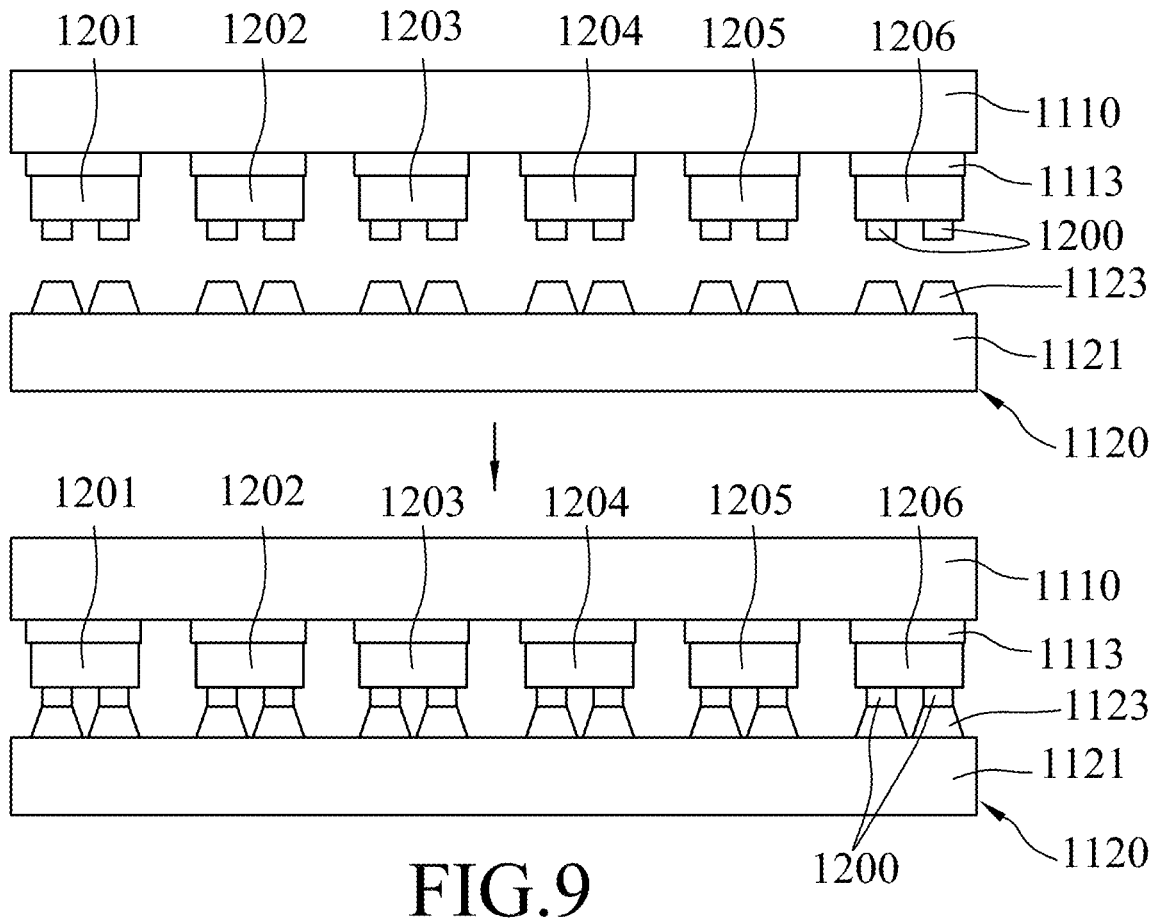

Referring to FIGS. 6 and 9, in step S130, the testing device 1120 is moved to be located below the main pick-up device 1110 and is aligned with the main pick-up device 1110. Alternatively, both the testing device 1120 and the main pick-up device 1110 may be moved or only the main pick-up device 1110 is moved, as long as the testing device 1120 and the main pick-up device 1110 are aligned. Then, the main pick-up device 1110 is operated to connect the microelements (1201 to 1206) to the testing electrodes 1123 of the testing device 1120. Specifically, two electrodes 1200 of each of the microelements (1201 to 1206) are electrically connected to corresponding two of the testing electrodes 1123.

Figure 10:
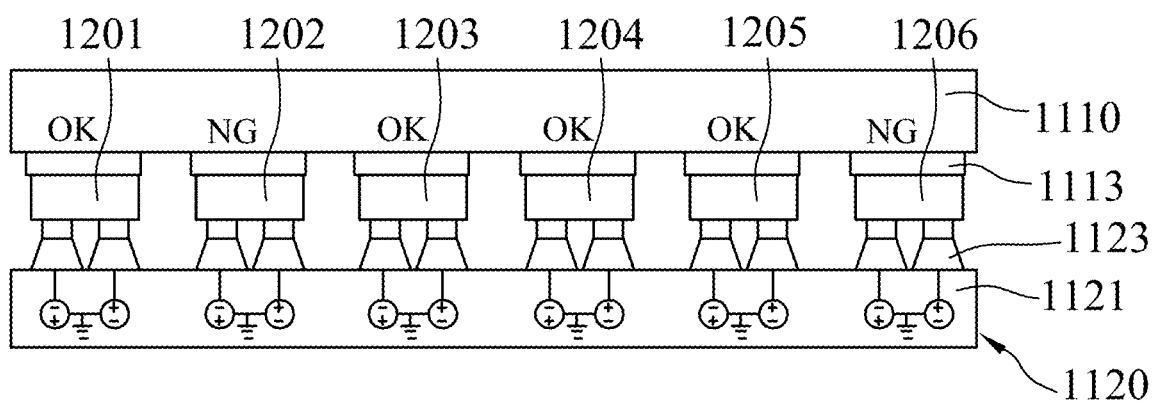
Figure 11:
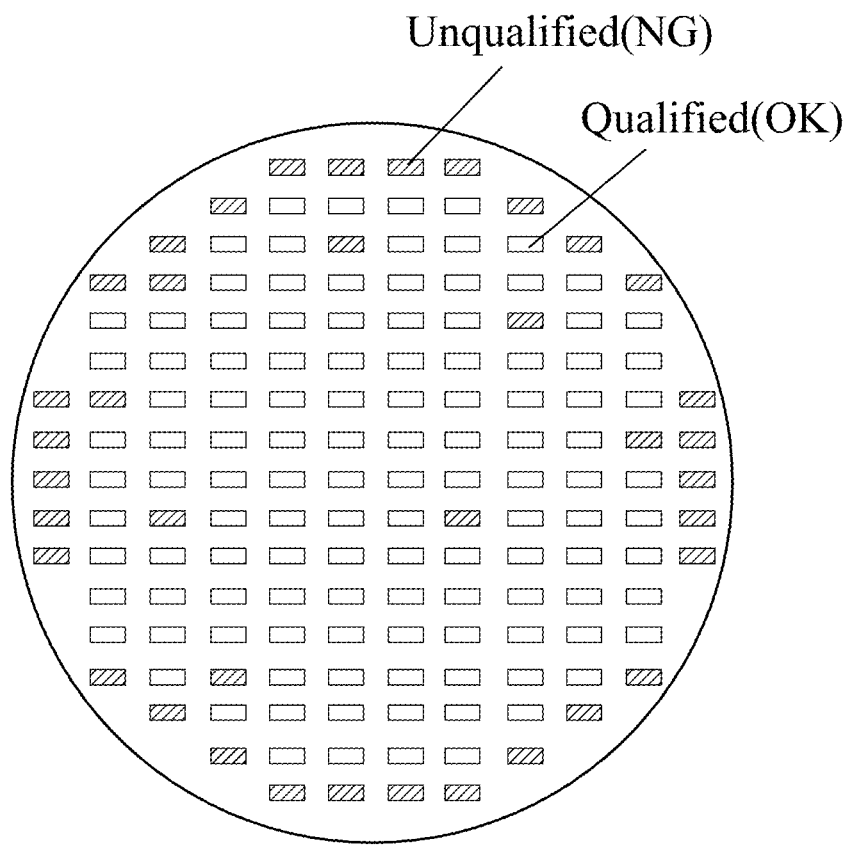
FIG. 11 is a schematic view showing a testing result of a testing step of the first embodiment of the transfer method, which reveals qualified and unqualified microelements.

Referring to FIGS. 6, 10 and 11, in step S140, a testing voltage is applied to the testing circuit 1122 to test the microelements (1201 to 1206) and to distinguish the unqualified microelements from the qualified microelements. FIG. 11 is a schematic view of the testing result, i.e., the defect pattern indicative of the unqualified microelements, in which the shaded elements denote the unqualified ones of the microelements. When the microelements are optical devices, in addition to testing the microelements via application of a voltage to the testing circuit 1122, the optical properties of the microelements, such as spectrum, wavelength, brightness, etc., are determinable at the same time by the optical testing device 1180.

Figure 7:
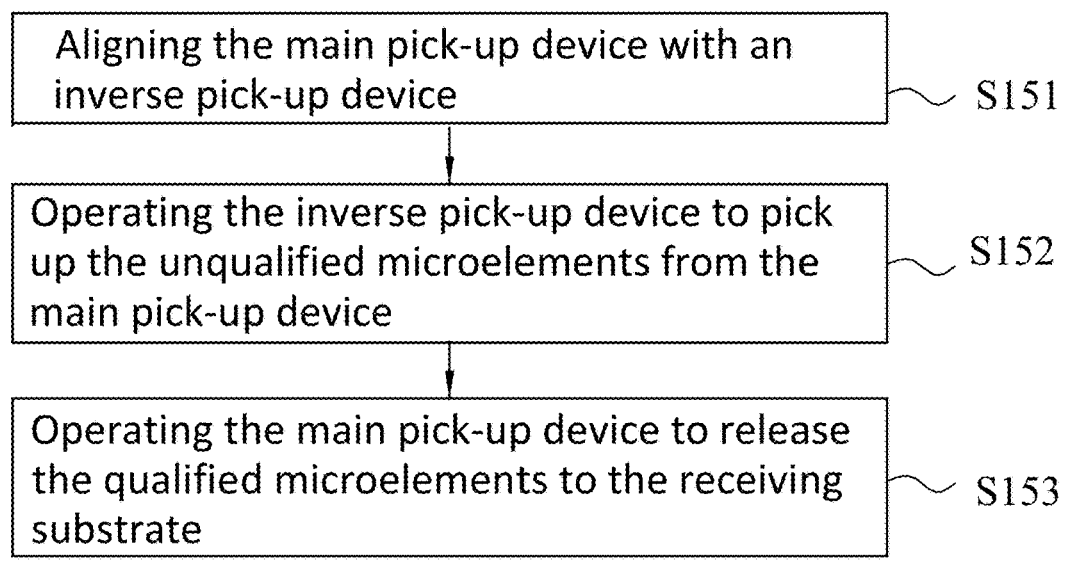
FIG. 7 is a flow chart of three sub-steps of the first embodiment of the transfer method.

Referring to FIGS. 6 and 7, in step S150, the second carrier plate 1140 (see FIG. 1) is moved to be located below the main pick-up device 1110 and is aligned with the main pick-up device 1110. Then, the main pick-up device 1110 is operated to release the qualified ones of the microelements to the receiving substrate 1230 (see FIG. 15) on the second carrier plate 1140. Referring to FIG. 7, in certain embodiment, step S150 includes three sub-steps S151 to S153.

Figure 12:
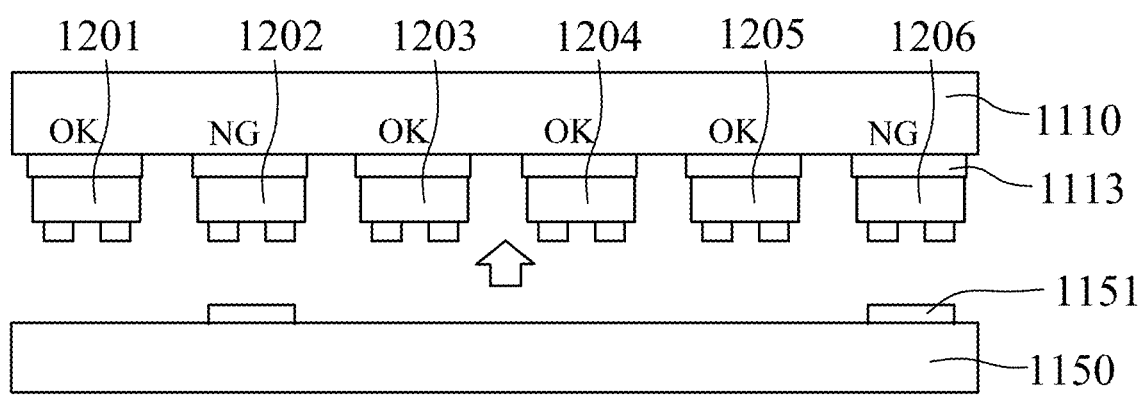
FIGS. 12 to 16 show different steps of the first embodiment of the transfer method.

Referring to FIGS. 7 and 12, in sub-step S151, the second carrier plate 1140 (see FIG. 1) is moved to be located below the main pick-up device 1110 and is aligned with the main pick-up device 1110.

Figure 13:
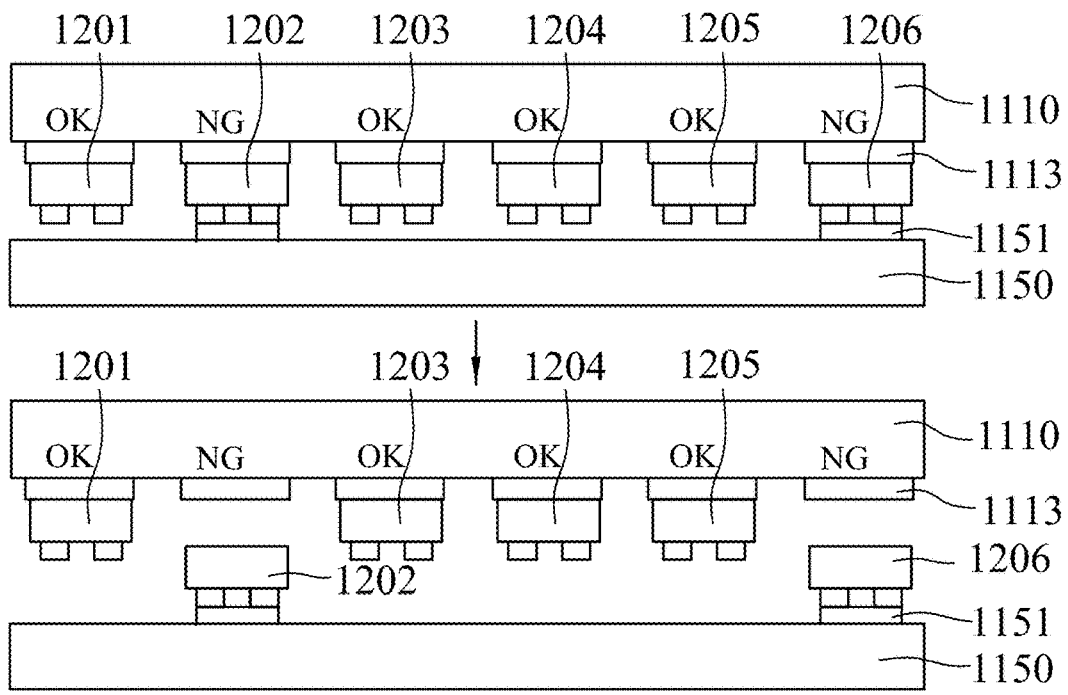
Figure 14:
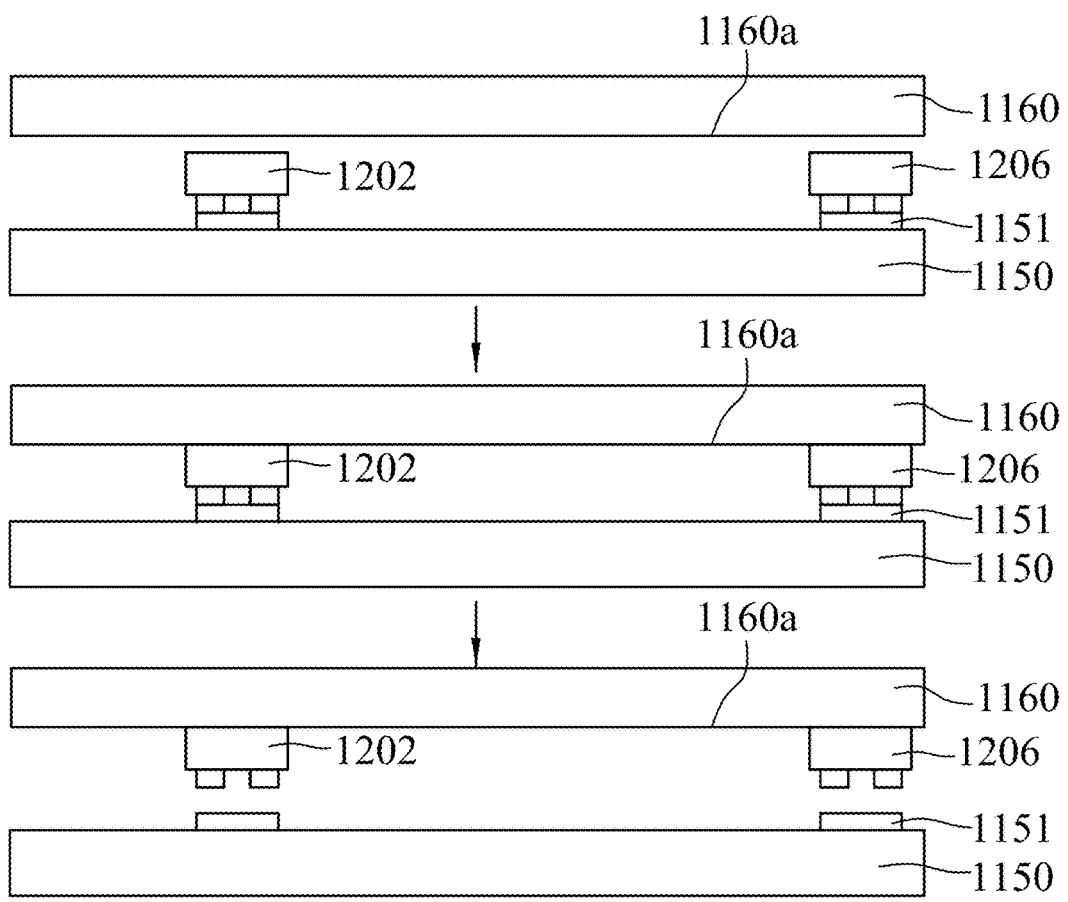

Referring to FIGS. 7, 13 and 14, in sub-step S152, the inverse pick-up device 1150 is operated to pick up the unqualified microelements 1202, 1206 from the main pick-up device 1110, and transfer the unqualified microelements 1202, 1206 to recycling device 1160, such that only the qualified microelements (1201 and 1203 to 1205) are connected to the main pick-up device 1110. The inverse pick-up device 1150 may pick up the unqualified microelements 1202, 1206 altogether at the same time, or may pick up the unqualified microelements 1202, 1206 one at a time, based on the number and type of the pick-up head 1151 of the inverse pick-up device 1150. In this embodiment, the adhesive surface 1160a of the recycling device 1160 serves for picking up the unqualified microelements (1202, 1206) from the inverse pick-up device 1150.

Figure 15:
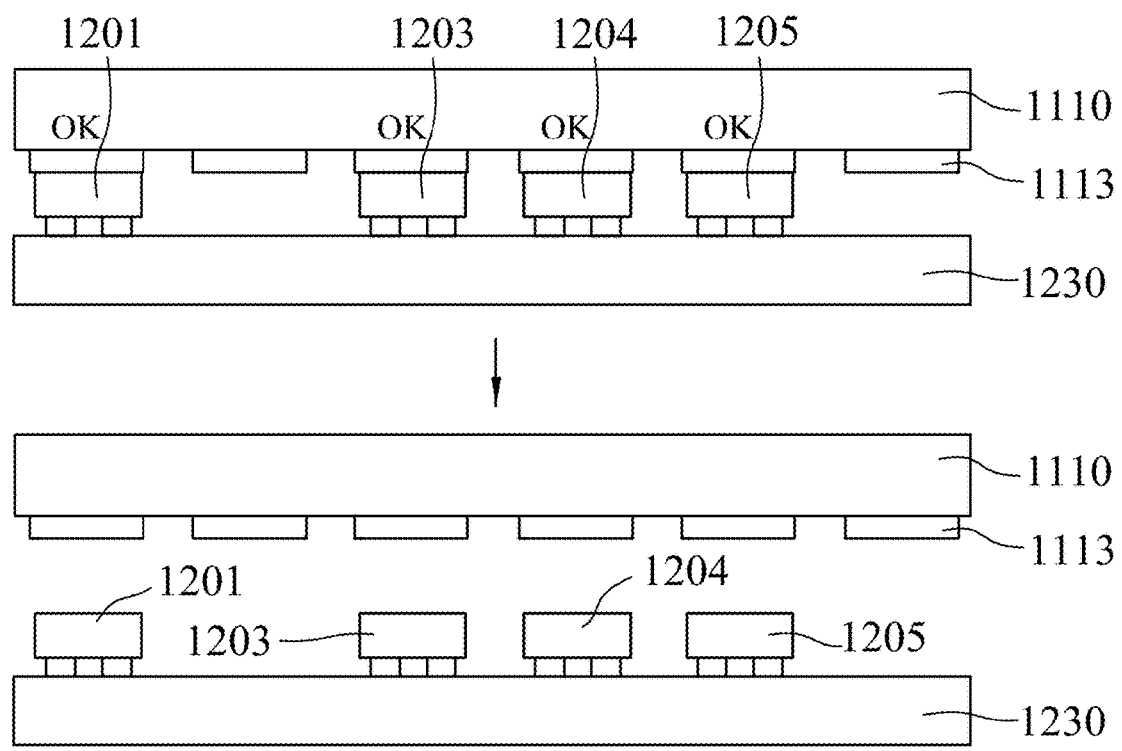

Referring to FIGS. 7 and 15, in sub-step S153, the second carrier plate 1140 (see FIG. 1) holding the receiving substrate 1230 is moved to be located below the main pick-up device 1110 and is aligned with the main pick-up device 1110. The main pick-up device 1110 is then operated to release the qualified microelements (1201 and 1203 to 1205) to the receiving substrate 1230. The transfer of the qualified microelements (1201 and 1203 to 1205) from the carrying substrate 1210 to the receiving substrate 1230 is therefore completed.

Steps S110 to S150 may be repeated in cycles to achieve mass transfer of the multiple microelements.

Figure 16:
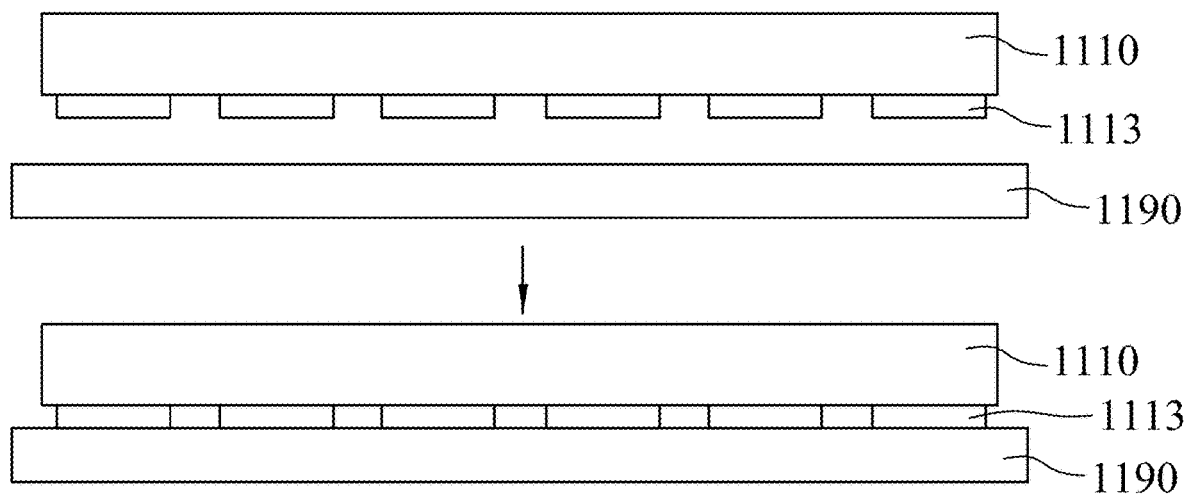

Referring to FIG. 16, after step S153, a cleaning step may be performed. In the cleaning step, the cleaning device 1190 is moved to be located below the main pick-up device 1110. The pick-up units 1113 of the main pick-up device 1110 are then operated to contact the adhesive layer of the cleaning device 1190 for one time or multiple times to clean the pick-up units 1113.

As mentioned above, the surface of each of the pick-up units 1113 of the main pick-up device 1110 may be formed by the elastic material, such as PDMS, for picking up the microelements.

Figure 17:
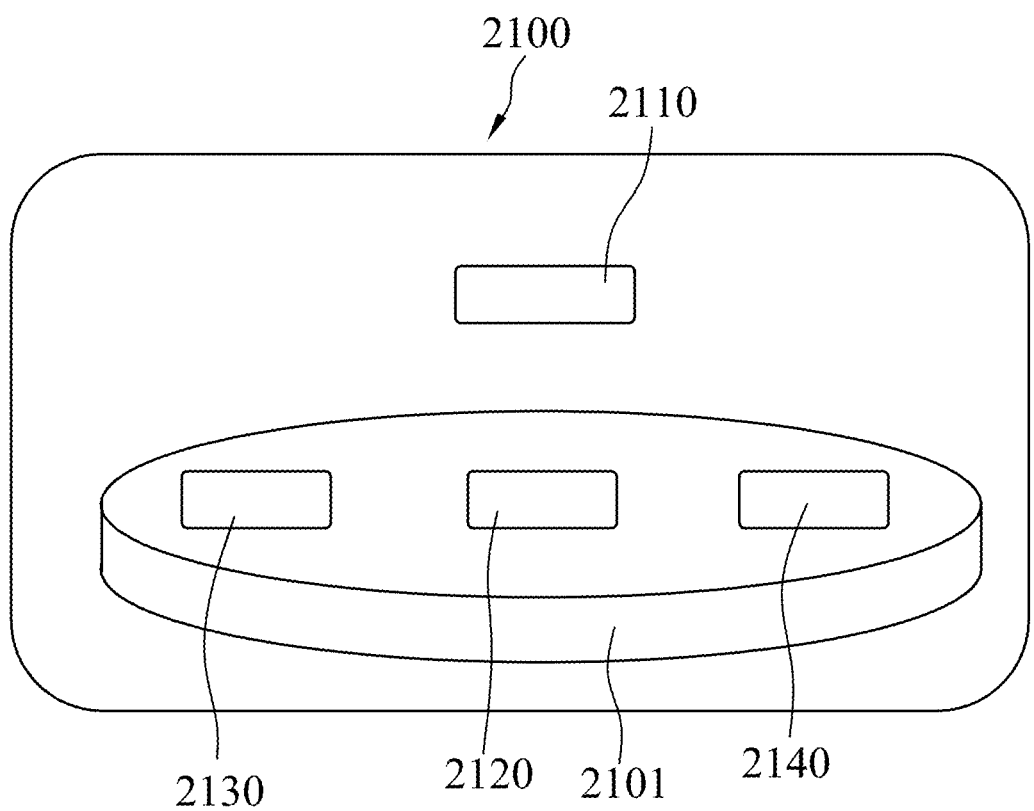
FIG. 17 is a schematic view of a third embodiment of the transfer system according to the present disclosure.
Figure 18:
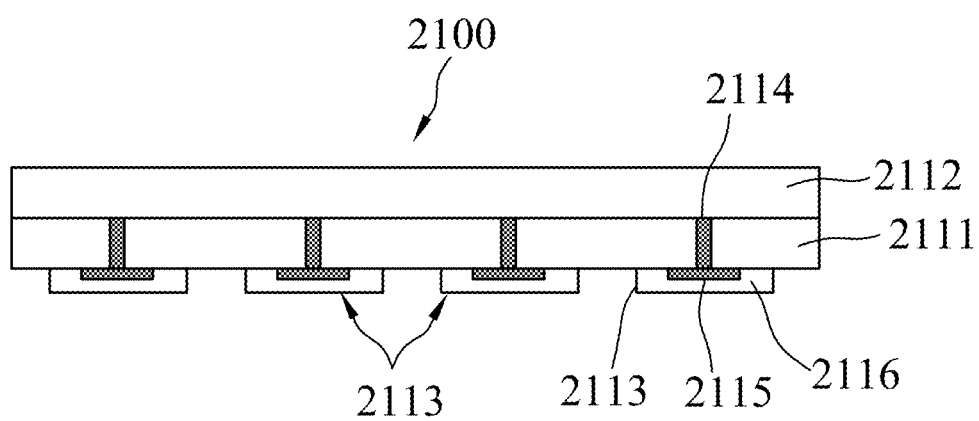
FIG. 18 is a schematic view of the main pick-up device of the third embodiment of the transfer system.

Referring to FIGS. 17 and 18, a third embodiment of the transfer system 2100 includes the main pick-up device 2110, the testing device 2120, the first carrier plate 2130 and the second carrier plate 2140. The main pick-up device 2110 includes a plurality of the pick-up units 2113 and a plurality of the micro switches that respectively control the pick-up units 2113 to pick up or release the microelements. The main pick-up device 2110 may be operated to pick up all of the microelements. Alternatively, the main pick-up device 2110 may be operated to pick up a part of the microelements. For example, the main pick-up device 2110 may be operated to only pick up the qualified microelements or to only pick up the unqualified microelements. In this embodiment, the transfer system 2100 further includes the support platform 2101 that holds the testing device 2120, the first carrier plate 2130 and the second carrier plate 2140.

In the third embodiment, the main pick-up device 2110 may utilize the electrostatic force or vacuum suction force to pick up the microelements. Referring back to FIG. 18, the substrate 2111 of the main pick-up device 2110 has an upper surface that is connected with a CMOS integrated circuit 2112, and a lower surface that is connected with the pick-up units 2113. Each of the pick-up units 2113 includes an electrostatic circuit including a connecting wiring 2114 and an electrode layer 2115. The connecting wiring 2114 of each of the pick-up units 2113 extends from the lower surface of the substrate 2111 to the upper surface of the substrate 2111 to be electrically connected to the CMOS integrated circuit 2112. The electrode layer 2115 of each of the pick-up units 2113 is connected to the lower surface of the substrate 2111 and is electrically connected to the connecting wiring 2114 of the pick-up unit 2113. Each of the pick-up units 2113 further includes a dielectric covering layer 2116 that covers the electrode layer 2115 of the pick-up unit 2113. The dielectric covering layer 2116 of each of the pick-up units 2113 may be made of an electrically insulating material, such as silicon dioxide, silicon nitride, etc. When a voltage is applied to the electrode layers 2115 of the pick-up units 2113, the dielectric covering layers 2116 of the pick-up units 2113 exert the electrostatic force to the microelements to pick up the same.

Figure 19:
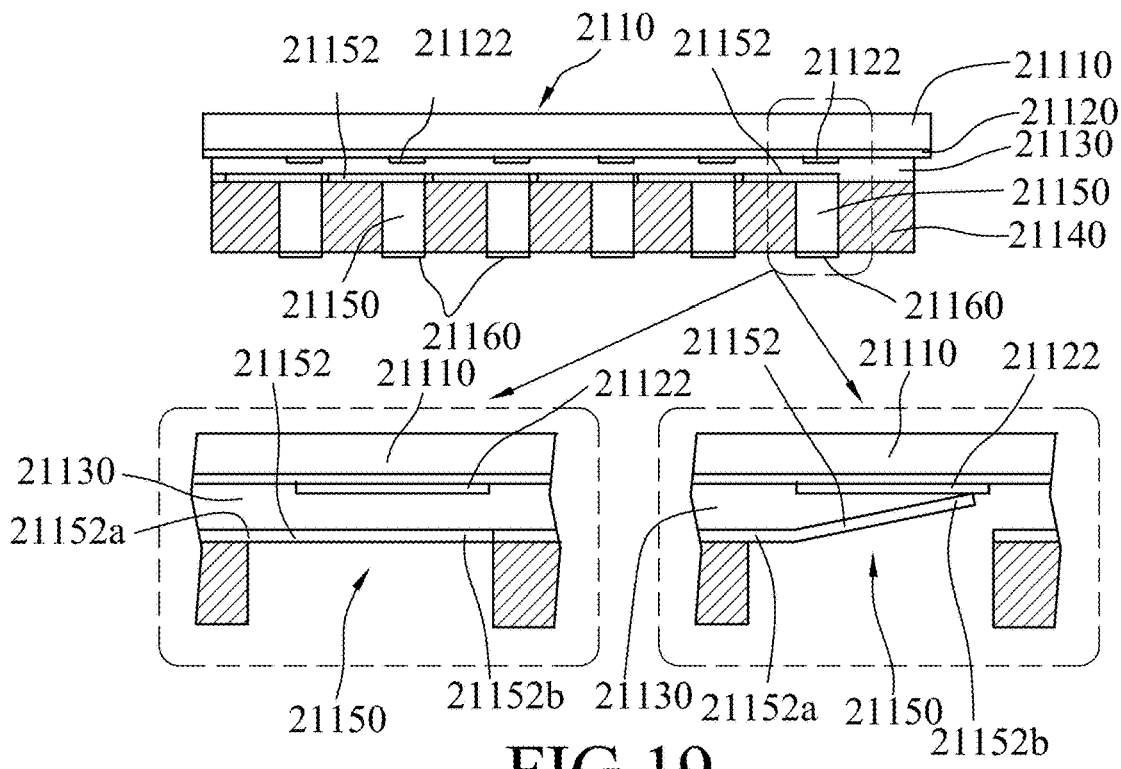
FIG. 19 is a schematic view showing an alternative construction of the main pick-up device of the third embodiment of the transfer system.

Referring to FIG. 19, an alternative construction of the third embodiment is provided. In the alternative construction, the main pick-up device 2110 utilizes the vacuum suction force to pick up the microelements and includes a substrate 21140, a CMOS storage circuit layer 21110 opposite to the substrate 21140, an address electrode layer 21120 connected to the CMOS storage circuit layer 21110 oppositely of the substrate 21140, and a chamber 21130 defined between the address electrode layer 21120 and the substrate 21140.

The main pick-up device 2110 includes a plurality of suction units 21160, each of which spatially communicates with the chamber 21130 via a vacuum path 21150 extending through the substrate 21140. The main pick-up device 2110 is further provided with a plurality of gates 21152 in the chamber 21130, each of which controls opening or closing of a corresponding one of the vacuum paths 21150. The size of each of the suction units 21160 (e.g., length or width) ranges from 1 μm to 1000 μm. The pitch between adjacent two of the suction units 21160 may range from 1 µm to 1000 µm, being, for example, 10 µm or 500 µm. In this embodiment, the vacuum paths 21150 are micro through holes formed in a substrate 21140 (e.g., a silicon substrate).

Specifically, the address electrode layer 21120 includes a plurality of address electrodes 21122. Each of the gates 21152 is a flexible metal sheet, and has opposite first and second end portions 21152a, 21152b. At least one of the first and second end portions 21152a, 21152b of each of the gates 21152 is connected to the substrate 21140. In this alternative construction, the first end portion 21152a of each of the gates 21152 is connected to the substrate 21140, and the second end portion 21152b of each of the gates 21152 is deformable and is not connected to the substrate 21140. There may be a spacing between the second end portion 21152b of each of the gates 21152 and the substrate 21140, as long as the vacuum paths 21150 can be substantially closed when the second end portions 21152b are not deformed.

Each of the address electrodes 21122 can be independently controlled to be switched on or off by the CMOS storage circuit layer 21110. For each of the address electrodes 21122, when the voltage is not applied to the address electrode 21122, the address electrode 21122 is switched off, and the second end portion 21152b of a corresponding one of the gates 21152 is not attracted by the address electrode 21122 and is not deformed. The corresponding vacuum path 21150 is therefore closed by the gate 21152 (see the left part of FIG. 19). When the voltage is applied to the address electrode 21122, the address electrode 21122 is switched on. The second end portion 21152b of the corresponding gate 21152 is attracted by the address electrode 21122 and is deformed toward the address electrode 21122 to open the corresponding vacuum path 21150 (see the right part of FIG. 19).

Figure 20:
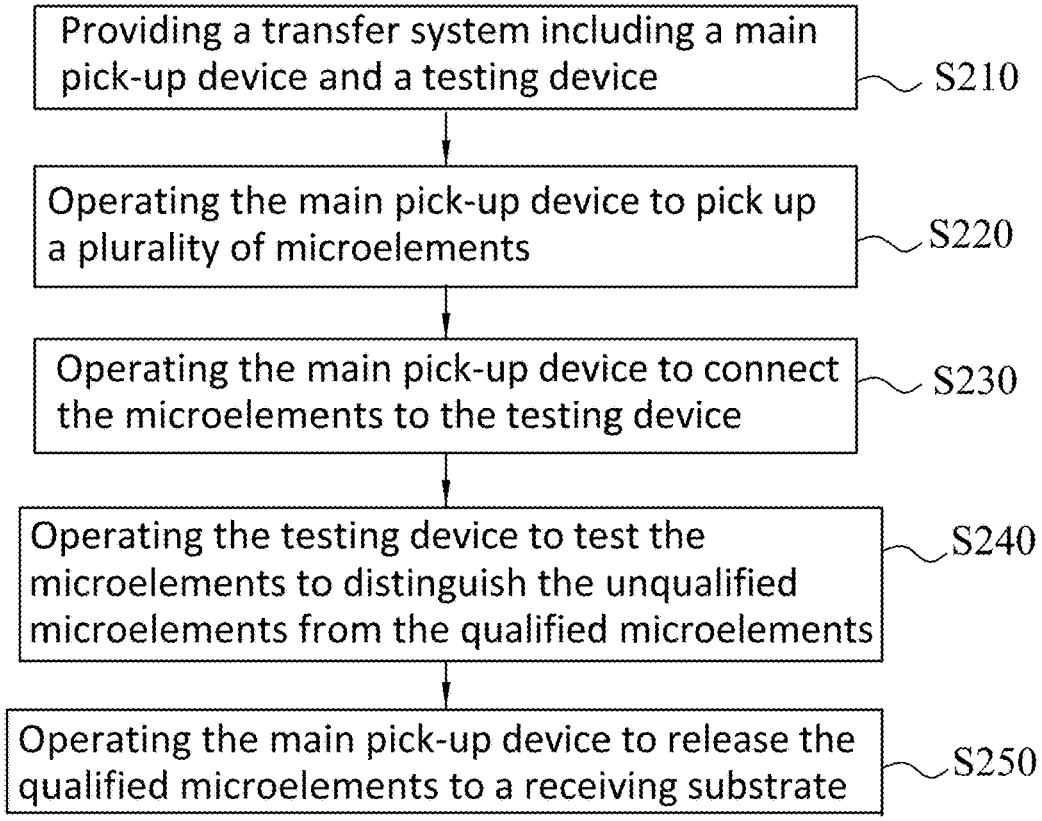
FIG. 20 is a flow chart of a second embodiment of the transfer method, which utilizes the transfer system of FIG. 17.

Referring to FIG. 20, a second embodiment of a transfer method for microelements is provided. The method utilizes the third embodiment of the transfer system 2100 (see FIG. 17), and includes steps S210 to S250.

Figure 21:
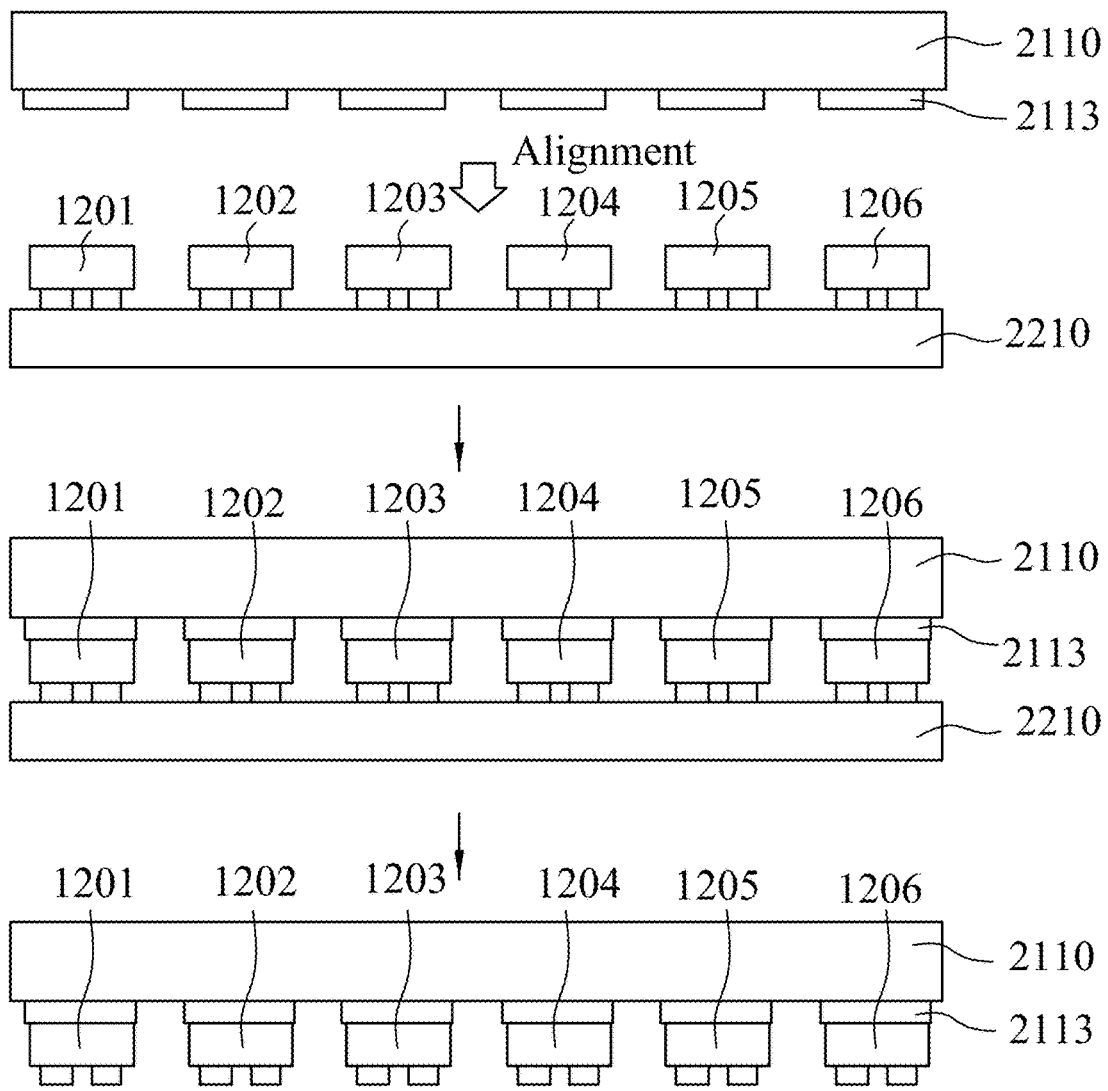
FIGS. 21 to 25 show different steps of the second embodiment of the transfer method.

Referring to FIGS. 17, 20 and 21, in step S210, the transfer system 2100 is provided. The first carrier plate 2130 holds the carrying substrate 2210, to which a plurality of the to-be-transferred microelements (1201 to 1206) are connected. The second carrier plate 2140 holds the receiving substrate 2230 (see FIG. 25).

In step S220, the carrying substrate 2210 is moved to be located above the first carrier plate 2130 and is aligned with the first carrier plate 2130. The pick-up units 2113 of the carrying substrate 2210 are operated to pick up the microelements (1201 to 1206).

Figure 22:
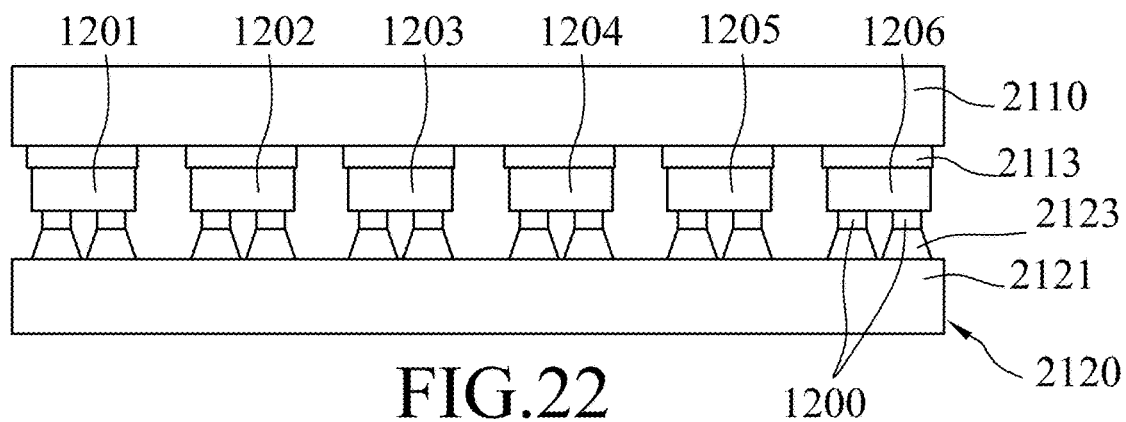

Referring to FIGS. 20 and 22, in step S230, the main pick-up device 2110 is operated to move to be located above the testing platform 2121 of the testing device 2120, and the microelements (1201 to 1206) are respectively brought into contact with the testing electrodes 2123 of the testing device 2120.

Figure 23:
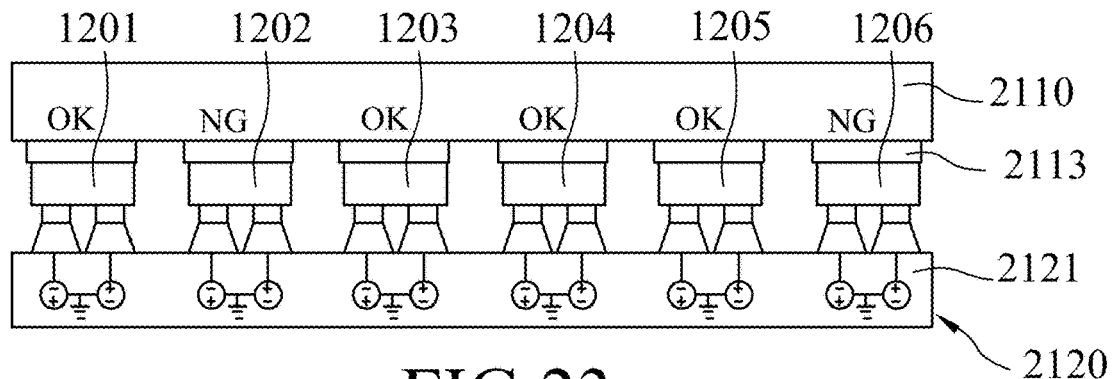

Referring to FIGS. 20 and 23, in step S240, the voltage is applied to the testing circuit of the testing device 2120 to test the microelements (1201 to 1206) to distinguish the unqualified microelements (1202, 1206) from the qualified microelements (1201 and 1203 to 1205).

Figure 24:
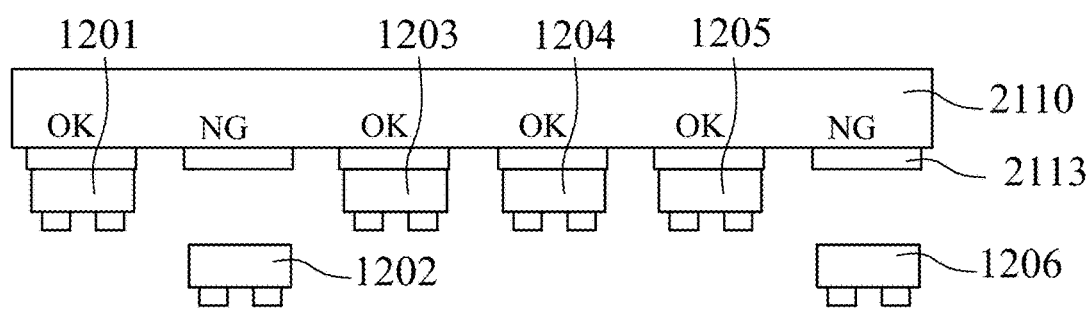
Figure 25:
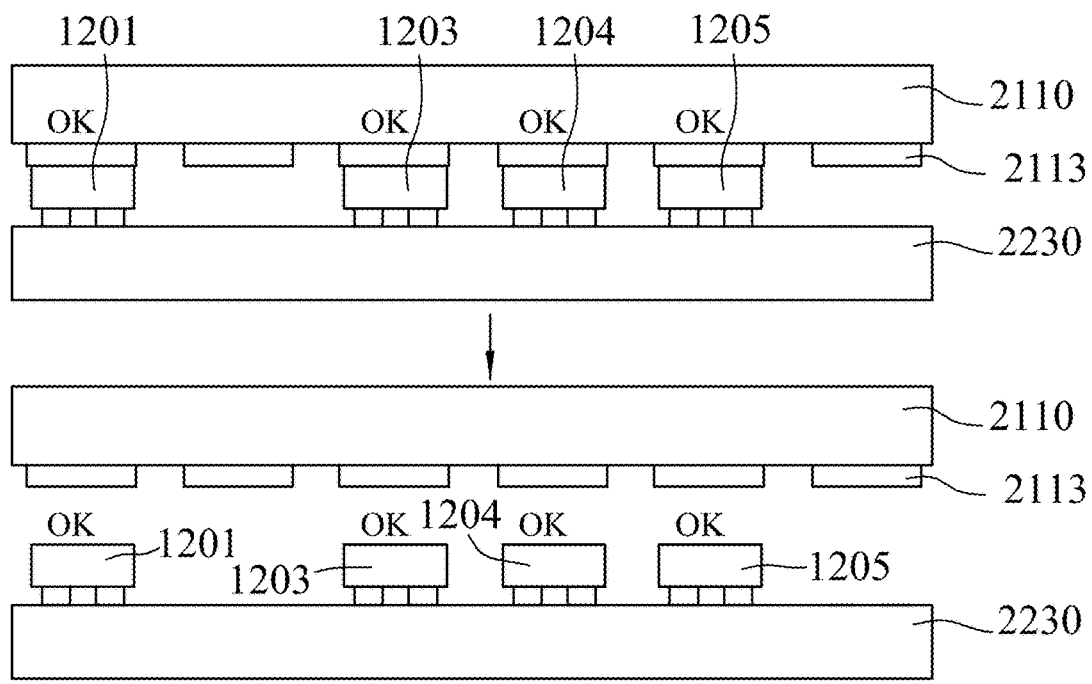

Referring to FIGS. 20, 24 and 25, in step S250, the main pick-up device 2110 is operated to release the qualified microelements (1201 and 1203 to 1205) to the receiving substrate 2230. Specifically, referring to FIG. 24, the main pick-up device 2110 is operated to be located above a recycling chamber (not shown), and then operated to release the unqualified microelements 1202, 1206. Then, referring to FIG. 25, the main pick-up device 2110 is operated to be located above the second carrier plate 2140, and is aligned with the receiving substrate 2230 held by the second carrier plate 2140. Afterwards, the main pick-up device 2110 is operated to release the qualified microelements (1201 and 1203 to 1205) to the receiving substrate 2230 to complete transferring the qualified microelements (1201 and 1203 to 1205) from the carrying substrate 2210 to the receiving substrate 2230.

Steps S210 to S250 may be repeated in cycles to achieve mass transfer of the multiple microelements.

In step S250, the qualified microelements (1201 and 1203 to 1205) may be released to the receiving substrate 2230, followed by releasing the unqualified microelements (1202, 1206) to the recycling chamber.

Figure 29:
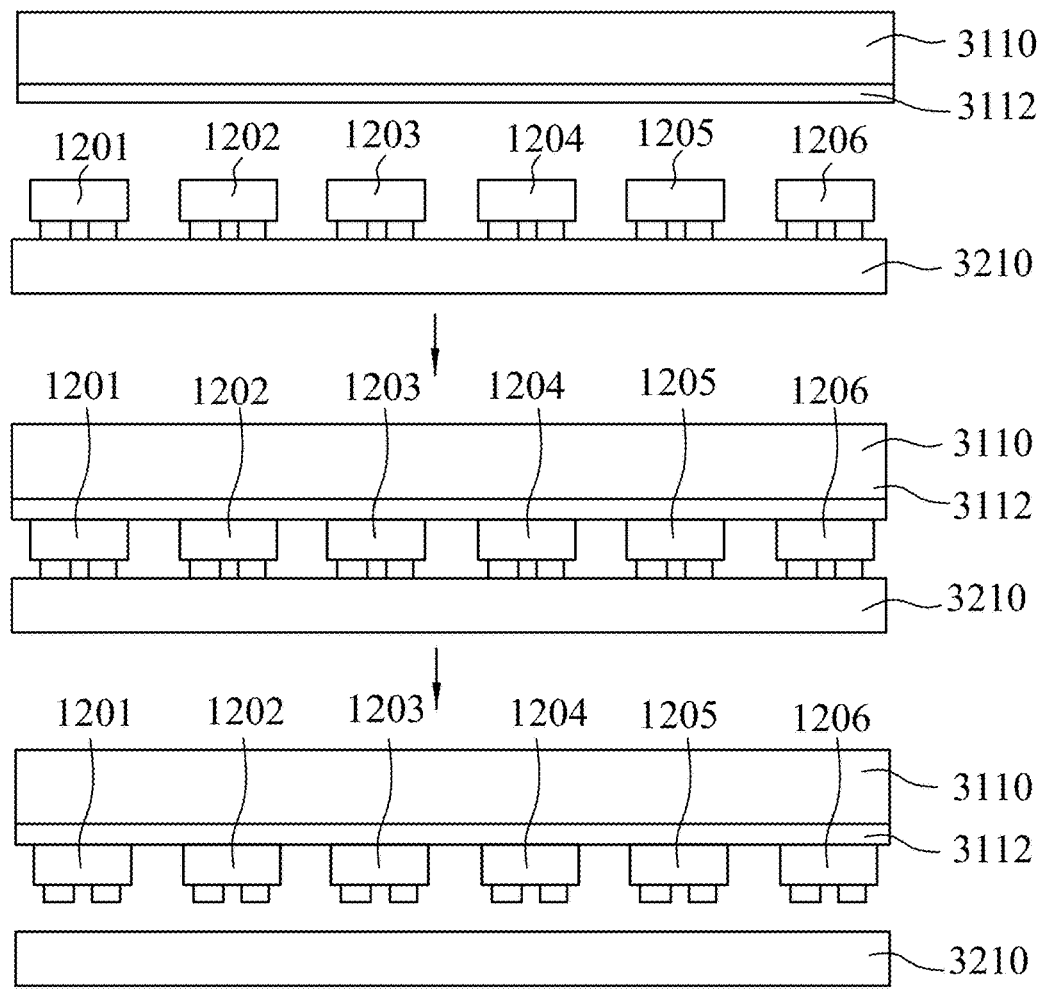
FIGS. 29 to 34 show different steps of the third embodiment of the transfer method.

Referring to FIG. 26, a fourth embodiment of the transfer system 3100 has a structure modified from that of the first embodiment, and includes the support platform 3101, the main pick-up device 3110, the testing device 3120, the first carrier plate 3130, the second carrier plate 3140, the alignment device 3170, the optical testing device 3180 and the cleaning device 3190. The fourth embodiment further includes a UV lighting device 3160. Referring to FIG. 29, the main pick-up device 3110 is light-transmissible, and may include a transparent substrate, such as glass or the like. The transparent substrate is further provided with a detachable layer 3112 for picking up the microelements (1201 to 1206). In this embodiment, the detachable layer 3112 is made of UV adhesive.

Referring to FIG. 27, a third embodiment of a transfer method for microelements is provided. The method utilizes the fourth embodiment of the transfer system 3100 (see FIG. 26), and includes steps S310 to S350.

Referring to FIGS. 26, 27 and 29, in step S310, the transfer system 3100 is provided. The first carrier plate 3130 carries the to-be-transferred microelements (1201 to 1206). The second carrier plate 3140 carries the receiving substrate 3230 (see FIG. 33).

In step S320, the surface of the main pick-up device 3110 is coated with the UV adhesive to form the detachable layer 3112. The first carrier plate 3130 is then moved to be located below the main pick-up device 3110, and is aligned with the main pick-up device 3110. The main pick-up device 3110 is operated to bring the detachable layer 3112 to contact the microelements (1201 to 1206) to pick the microelements (1201 to 1206) up from the carrying substrate 3210.

Figure 30:
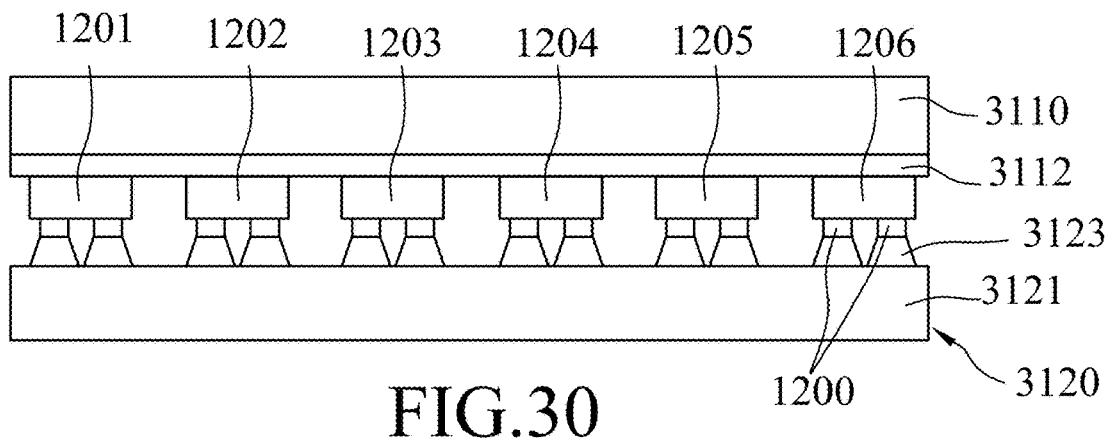

Referring to FIGS. 27 and 30, in step S330, the testing device 3120 is moved to be located below the main pick-up device 3110, and is aligned with the main pick-up device 3110. The main pick-up device 3110 is then operated to move the microelements (1201 to 1206) to connect the electrodes 1200 of the microelements 1201 to 1206 to the testing electrodes 1123 of the testing device 3120.

Figure 31:
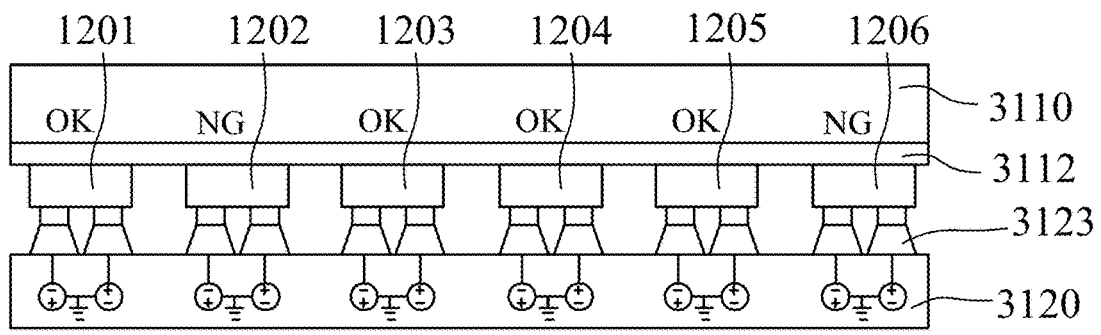

Referring to FIGS. 27 and 31, in step S340, the voltage is applied to the testing circuit of the testing device 3120 to test the microelements (1201 to 1206) to distinguish the unqualified microelements (1202, 1206) from the qualified microelements (1201 and 1203 to 1205).

Figure 28:
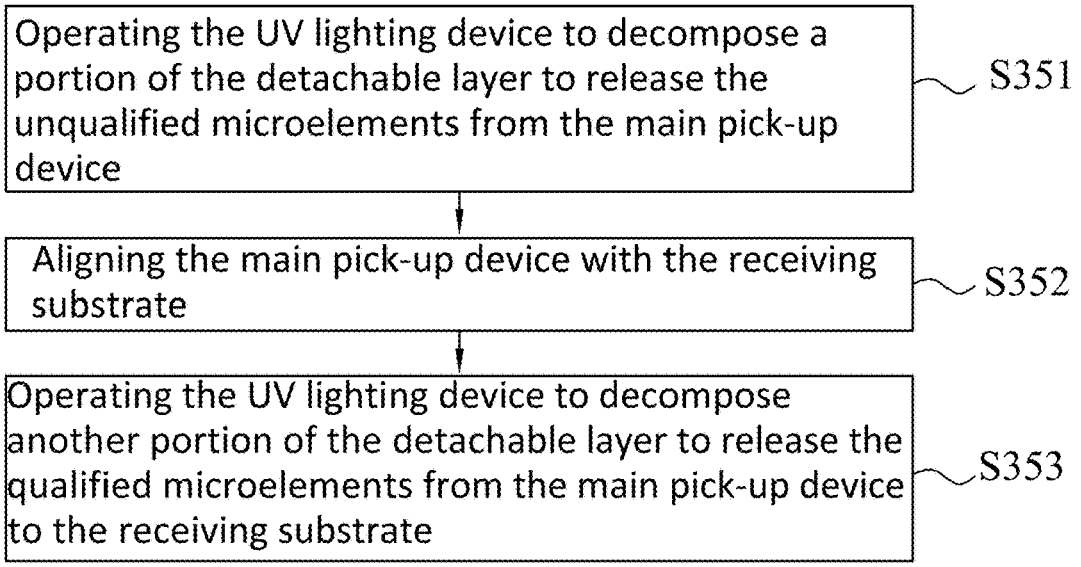
FIG. 28 is a flow chart of three sub-steps of the third embodiment of the transfer method.

Referring to FIG. 27, in step S350, the qualified microelements (1201 and 1203 to 1205) are released to the receiving substrate 3230. Referring to FIG. 28, in certain embodiments, step S350 includes three sub-steps S351 to S353.

Figure 32:
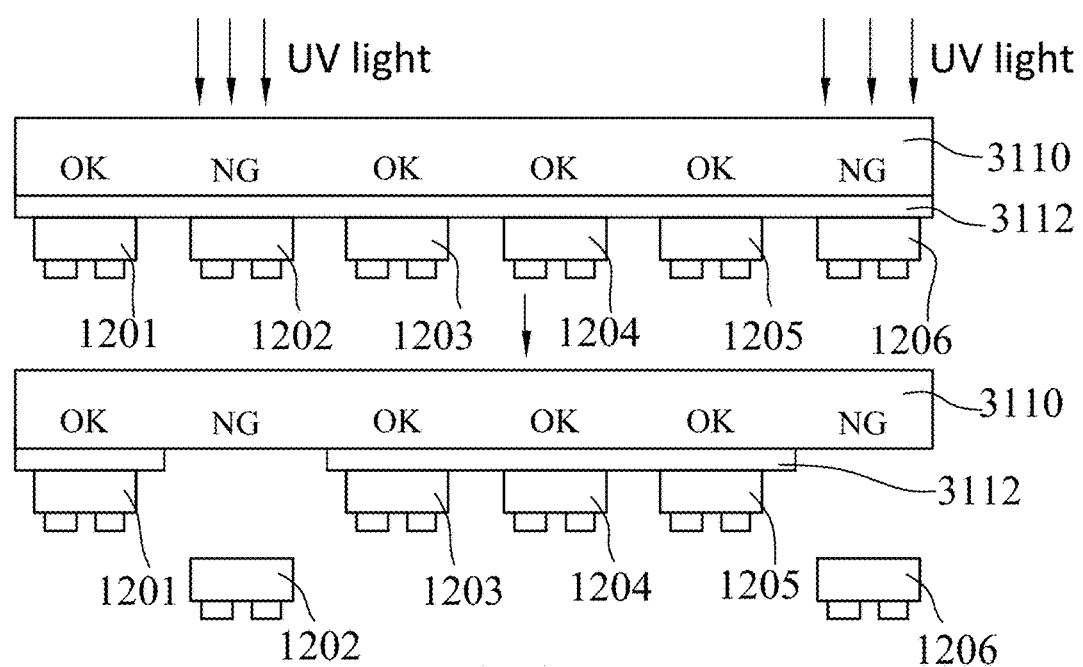

Referring to FIGS. 26, 28 and 32, in sub-step S351, the testing device 3120 is operated to move away from the main pick-up device 3110. Then, the UV lighting device 3160 is operated to emit UV light toward the unqualified microelements 1202, 1206 through the light-transmissible main pick-up device 3110 to decompose a portion of the detachable layer 3112 corresponding in position to the unqualified microelements (1202, 1206), such that the unqualified microelements 1202, 1206 are released from the main pick-up device 3110.

Figure 33:
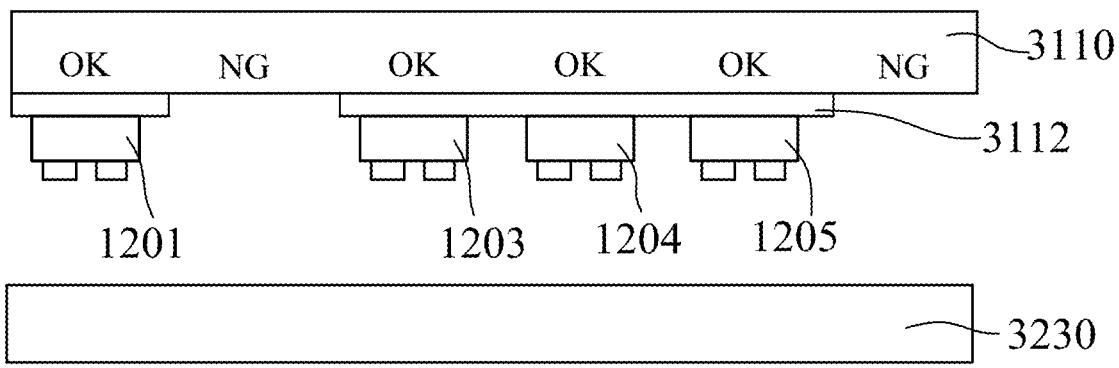

Referring to FIGS. 28 and 33, in sub-step S352, the second carrier plate 3140 holding the receiving substrate 3230 is moved to be located below the main pick-up device 3110 and is aligned with the main pick-up device 3110.

Figure 34:
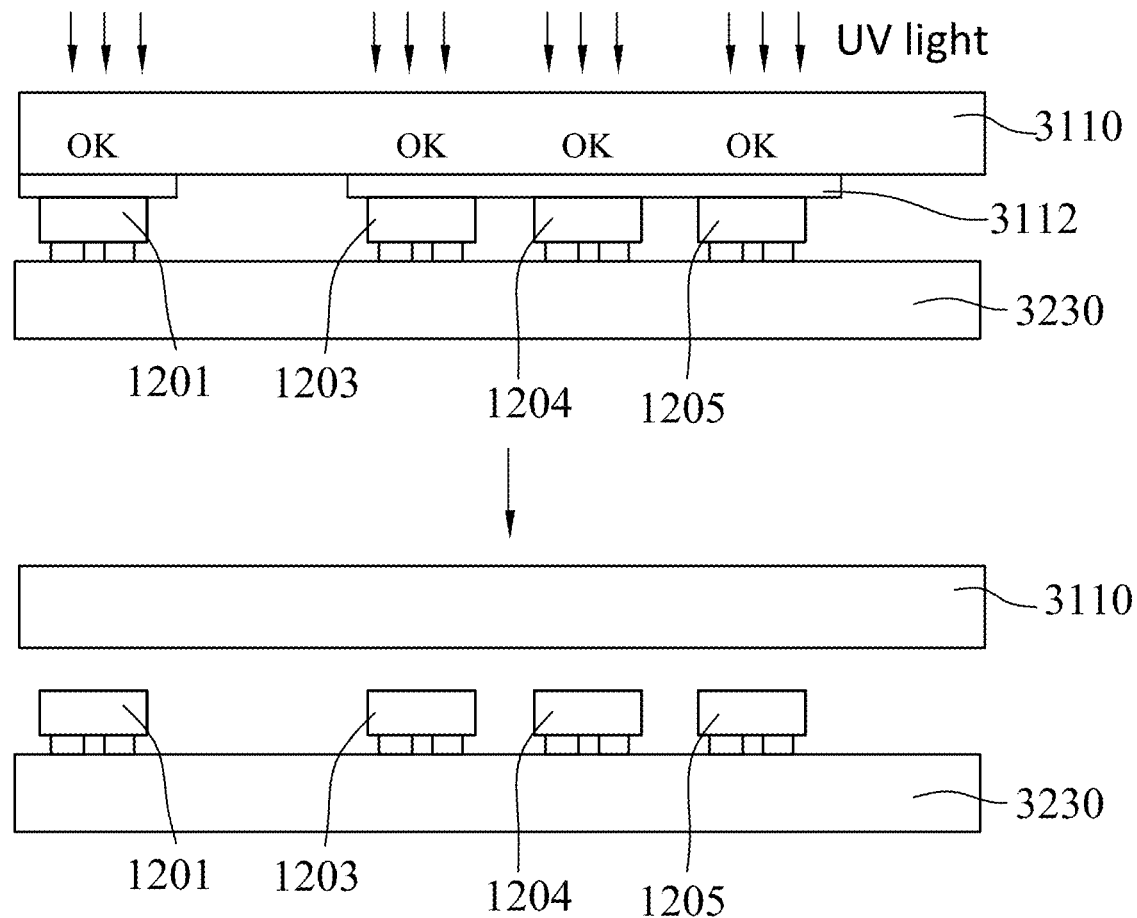

Referring to FIGS. 28 and 34, in sub-step S353, the UV lighting device 3160 is once operated to emit UV light toward the qualified microelements (1201 and 1203 to 1205) through the light-transmissible main pick-up device 3110 to decompose another portion of the detachable layer 3112 corresponding in position to the qualified microelements (1201 and 1203 to 1205), such that the qualified microelements (1201 and 1203 to 1205) are released from the main pick-up device 3110 to the receiving substrate 3230, thereby transferring the qualified microelements (1201 and 1203 to 1205) from the carrying substrate 3210 to the receiving substrate 3230.

Steps S310 to S350 may be repeated in cycles to achieve mass transfer of the multiple microelements.

Referring to FIG. 26, after one of the cycles of Steps 310 to 350 is completed, the cleaning device 3190 may be used for removing the UV adhesive residue on the main pick-up device 3110.

Alternatively, in step S350, sub-steps S351 to S353 may be carried out in a reverse order, i.e., the qualified microelements (1201 and 1203 to 1205) may be first released to the receiving substrate 3230, followed by releasing the unqualified microelements (1202, 1206).

In certain embodiments, the detachable layer 3112 may be made of a thermal release adhesive, and the UV lighting device 3160 may be replaced with a laser emitting device for emitting laser to decompose at least a portion of the detachable layer 3112.

Figure 35:
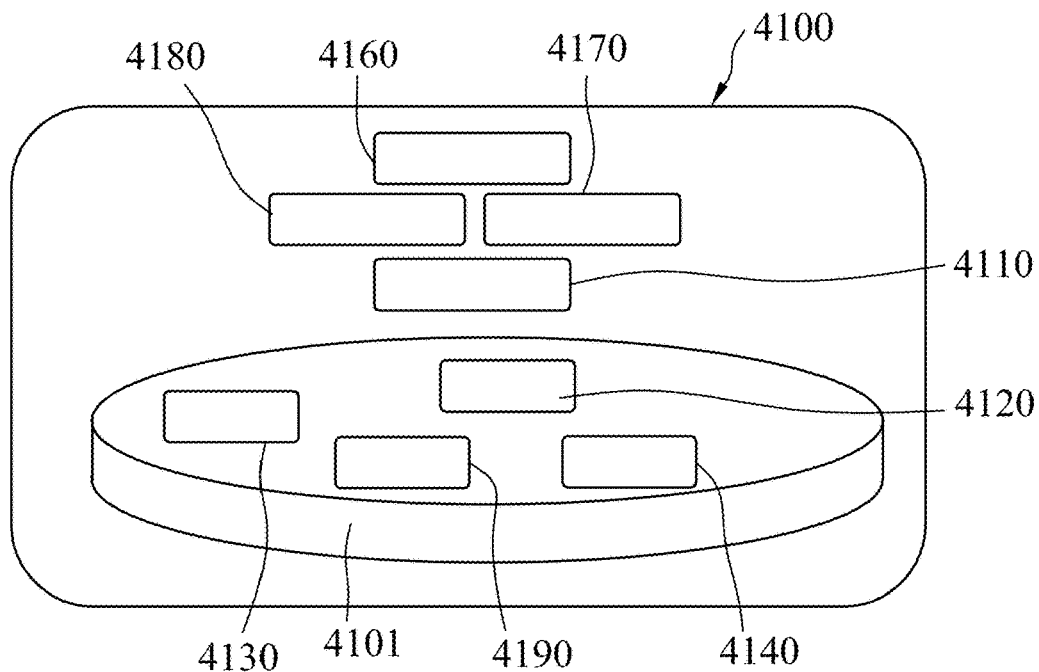
FIG. 35 is a schematic view of a fifth embodiment of the transfer system according to the present disclosure.

Referring to FIG. 35, a fifth embodiment of the transfer system 4100 has a structure modified from that of the fourth embodiment, and includes the support platform 4101, the main pick-up device 4110, the testing device 4120, the first carrier plate 4130, the second carrier plate 4140, the UV lighting device 4160, the alignment device 4170 and the optical testing device 4180. Compared to the fourth embodiment, the fifth embodiment of the transfer system 4100 further includes a hydrolysis device 4190. The detachable layer 4112 formed on the main pick-up device 4110 (see FIG. 38) is made of UV hydrolysis adhesive, which can generally be decomposed at room temperature. A UV-cured UV hydrolysis adhesive can only be decomposed at a higher temperature (e.g., 85$t$).

Figure 36:
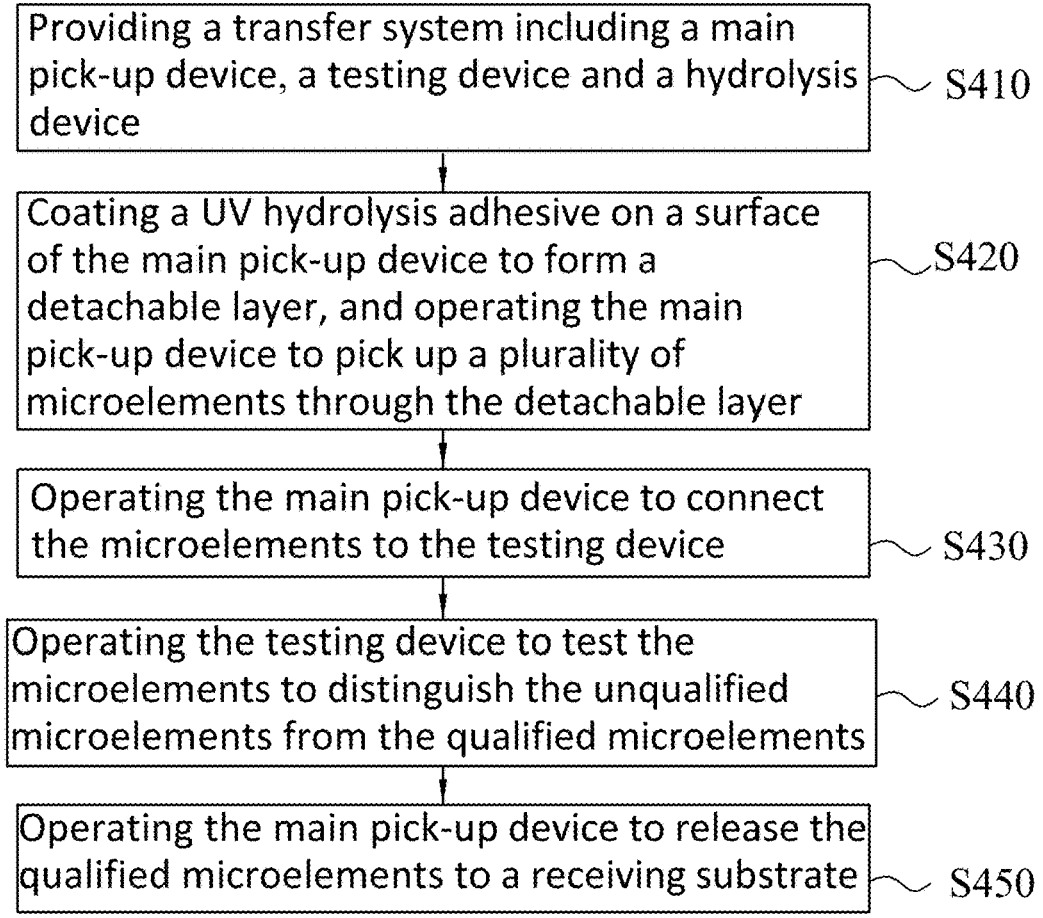
FIG. 36 is a flow chart of a fourth embodiment of the transfer method, which utilizes the transfer system of FIG. 35.

Referring to FIG. 36, a fourth embodiment of a transfer method for microelements is provided. The method utilizes the fifth embodiment of the transfer system 4100, and includes steps S410 to S450.

Referring to FIGS. 35, 36 and 38, in step S410, the transfer system 4100 is provided. The main pick-up device 4110 is light-transmissible, and may include the transparent substrate, such as glass or the like. The first carrier plate 4130 carries the to-be-transferred microelements (1201 to 1206). The second carrier plate 4140 carries the receiving substrate 4230 (see FIG. 42).

In step S420, the surface of the main pick-up device 4110 is coated with the UV hydrolysis adhesive to form the detachable layer 4112. The first carrier plate 4130 is then moved to be located below the main pick-up device 4110, and is aligned with the main pick-up device 4110. The main pick-up device 4110 is operated to bring the detachable layer 4112 to contact the microelements 1201 to 1206 to pick the microelements (1201 to 1206) up from the carrying substrate 4210.

Figure 39:
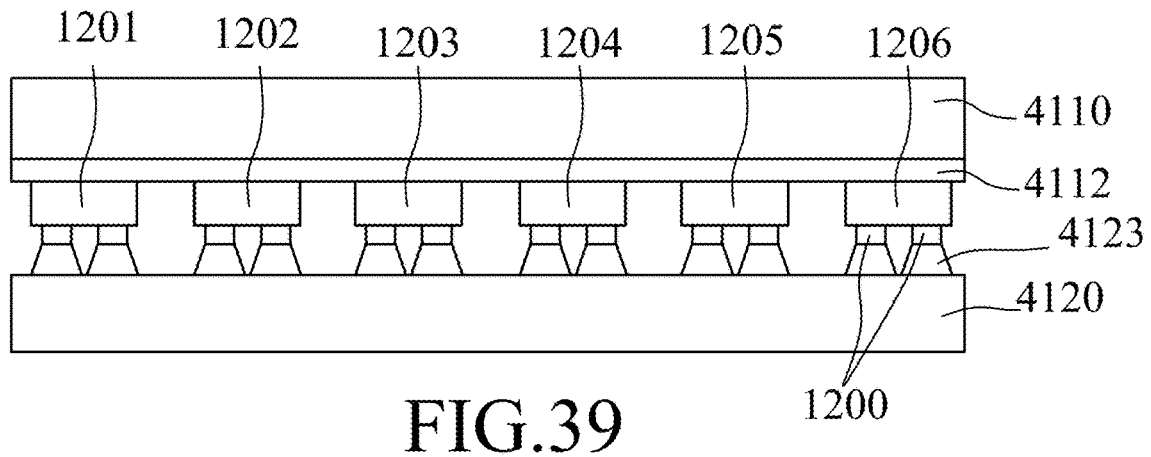

Referring to FIGS. 36 and 39, in step S430, the testing device 4120 is moved to be located below the main pick-up device 4110, and is aligned with the main pick-up device 4110. The main pick-up device 4110 is then operated to move the microelements (1201 to 1206) to connect the electrodes 1200 of the microelements 1201 to 1206 to the testing electrodes 4123 of the testing device 4120.

Figure 40:
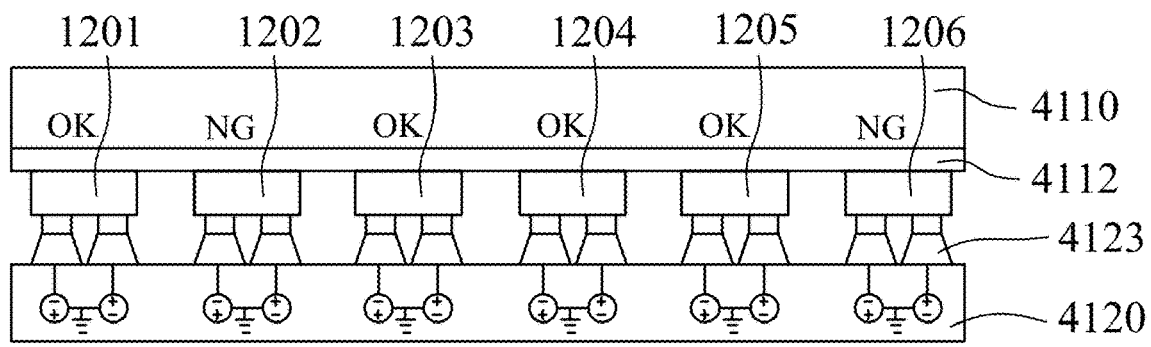

Referring to FIGS. 36 and 40, in step S440, the voltage is applied to the testing circuit of the testing device 4120 to test the microelements (1201 to 1206) to distinguish the unqualified microelements (1202, 1206) from the qualified microelements (1201 and 1203 to 1205).

Referring to FIGS. 36 and 37, in step S450, the qualified microelements (1201 and 1203 to 1205) are released to the receiving substrate 4230 (see FIG. 43). Referring to FIG. 37, in certain embodiments, step S450 includes four sub-steps S451 to S454.

Figure 41:
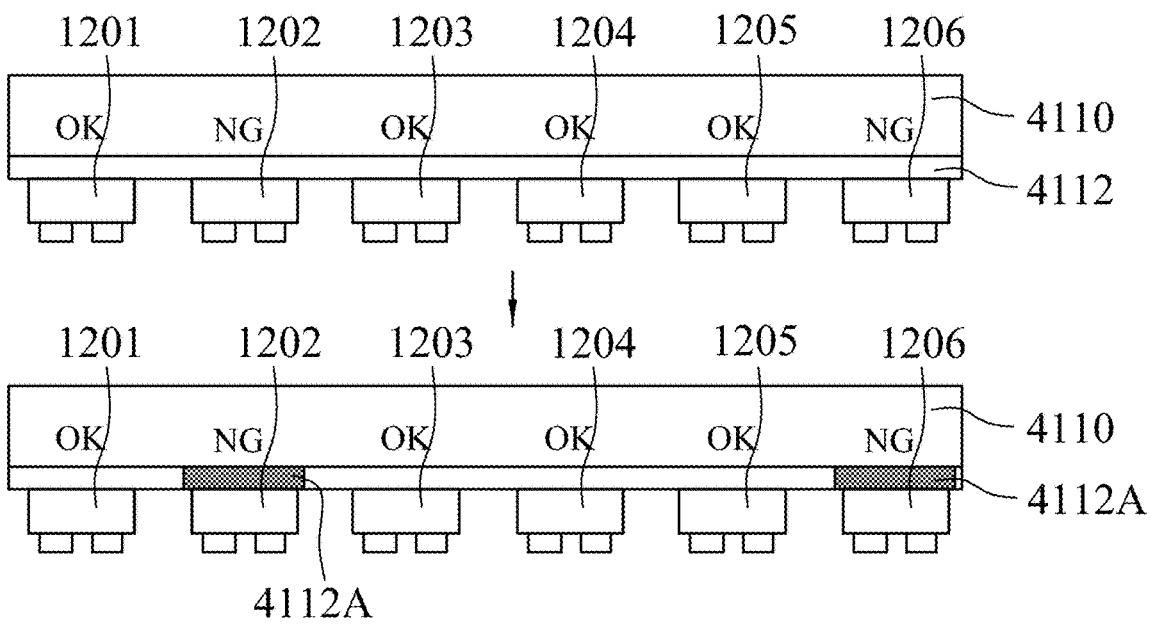

Referring to FIGS. 35, 37 and 41, in sub-step S451, the testing device 4120 is operated to move away from the main pick-up device 4110. Then, the UV lighting device 4160 is operated to emit UV light toward the unqualified microelements 1202, 1206 through the light-transmissible main pick-up device 4110 to solidify a portion of the detachable layer 4112 corresponding in position to the unqualified microelements (1202, 1206) into at least one solidified region 4112A.

Referring to FIGS. 35, 37 and 42, in sub-step S452, the second carrier plate 4140 holding the receiving substrate 4230 is moved to be located below the main pick-up device 4110 and is aligned with the main pick-up device 4110.

Referring to FIGS. 35, 37 and 43, in sub-step S453, the hydrolysis device 4190 is operated to decompose the detachable layer 4112 other than the solidified region 4112A, at room temperature, to release the qualified microelements (1201 and 1203 to 1205) from the main pick-up device 4110 to the receiving substrate 4230, thereby transferring the qualified microelements (1201 and 1203 to 1205) from the carrying substrate 4210 to the receiving substrate 4230.

Figure 44:
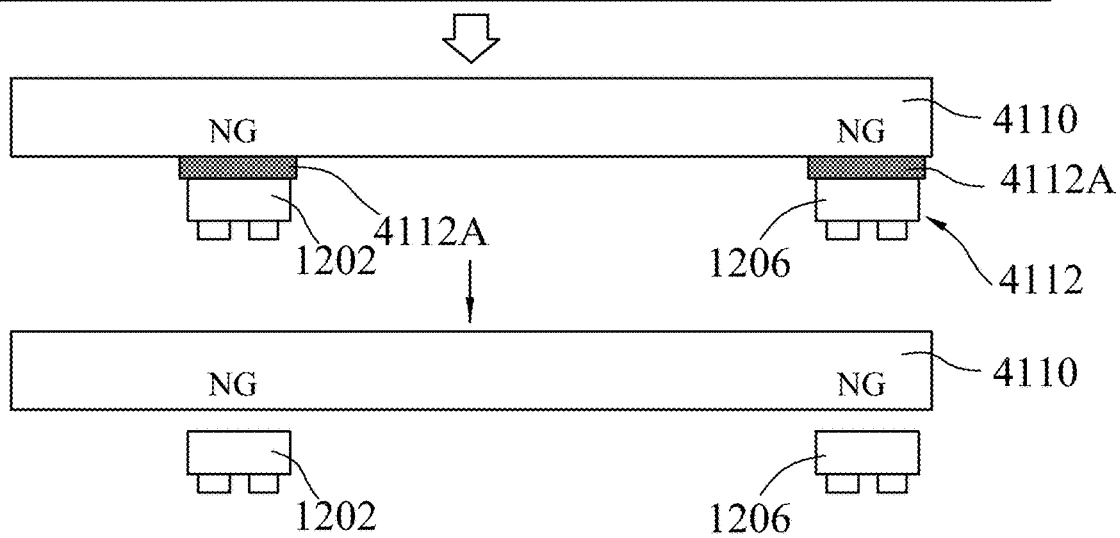

Referring to FIGS. 35, 37 and 44, in sub-step S454, the receiving substrate 4230 is moved away from the main pick-up device 4110. Then, the hydrolysis device 4190 is once operated to decompose the solidified region 4112A of the detachable layer 4112, at a temperature above 85° C., to release the unqualified microelements (1202, 1206) from the main pick-up device 4110.

Steps S410 to S450 may be repeated in cycles to achieve mass transfer of the multiple microelements.

In certain embodiments, the main pick-up device 4110 may further include a cleaning device for removing the UV hydrolysis adhesive residue on the main pick-up device 4110.

Referring to FIGS. 36 and 43, in step S450, a portion of the detachable layer 4112 corresponding in position to the qualified microelements (1201 and 1203 to 1205) may be first cured, followed by removing the unqualified microelements 1202, 1206 from the main pick-up device 4110 at room temperature. The qualified microelements (1201 and 1203 to 1205) are then released from the main pick-up device 4110 at a higher temperature above 85° C.

The transfer systems 1100, 2100, 3100, 4100 and the transfer methods respectively using these transfer systems 1100, 2100, 3100, 4100 according to the present disclosure may be used for transferring the microelements of different sizes, such as those ranging from 100 µm to 5000 µm, and may even be applied to the microelements with a size below 100 µm. Generally, the transfer methods respectively using the first, second and third embodiments of the transfer systems 1100, 2100, 3100 are applicable to transferring the microelements having a size below 100 µm, in which after the detachable layer 3112, 4112 is removed, the qualified and unqualified microelements are released from the main pick-up device 3110, 4110 by gravity. On the other hand, the transfer methods respectively using the fourth and fifth embodiments of the transfer systems 3100, 4100 are applicable to transferring the microelements having a size greater than 100 µm. However, the transfer systems 3100, 4100 and the transfer methods using the same may be applicable to transfer the microelements of the size below 100 µm. In this case, since the microelements are still attachable to the main pick-up device 3110, 4110 via the van der Waals force or the electrostatic force after the detachable layer 3112, 4112 is decomposed, the inverse pick-up device 1150 is needed to remove the unqualified microelements from the main pick-up device 3110, 4110.

The abovementioned transfer systems 1100, 2100, 3100, 4100 and transfer methods according to the present disclosure may be used for multiple transferring, testing and selecting of the microelements.

The abovementioned transfer systems 1100, 2100, 3100, 4100 and transfer methods according to the present disclosure may be used for manufacturing a variety of electronic devices, including cell phones, tablet computers, etc.

This disclosure also provides a method of manufacturing a microelement device using any one of the abovementioned transfer methods, and the microelement device manufactured thereby. This disclosure also provides an electronic apparatus including the microelement device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A transfer system for transferring a plurality of microelements to a receiving substrate, said transfer system comprising:
    a main pick-up device;
    a testing device including a testing platform, a testing circuit mounted to said testing platform, and a plurality of testing electrodes mounted to said testing platform and electrically connected to said testing circuit;
    a first carrier plate configured for releasably holding the microelements; and
    a second carrier plate configured for releasably holding the receiving substrate,
    wherein said main pick-up device is operable to releasably pick up the microelements from said first carrier plate and correspondingly position the microelements on said testing electrodes of said testing device,
    wherein said testing device is operable to test the microelements positioned thereon to distinguish unqualified ones of the microelements from qualified ones of the microelements, and
    wherein said main pick-up device is operable to release the qualified ones of the microelements to the receiving substrate.

2. The transfer system as claimed in claim 1, further comprising an inverse pick-up device that is operable to releasably pick up the unqualified ones of the microelements from said main pick-up device, wherein said inverse pick-up device exerts an attraction force on the microelements that is greater than an attraction force exerted on the microelements by said main pick-up device.

3. The transfer system as claimed in claim 2, further comprising a recycling device having an adhesive surface that is configured for picking up the unqualified ones of the microelements from said inverse pick-up device.

4. The transfer system as claimed in claim 1, further comprising a support platform on which said testing device, said first carrier plate and said second carrier plate are separately disposed, said main pick-up device being disposed above said testing device, said first carrier plate and said second carrier plate oppositely of said support platform.

5. The transfer system as claimed in claim 4, wherein said support platform is horizontally movable relative to said main pick-up device, and said main pick-up device is immobile horizontally.

6. The transfer system as claimed in claim 1, wherein:
    said main pick-up device is light-transmissible; and
    said transfer system further comprises an optical device that is disposed above said main pick-up device.

7. The transfer system as claimed in claim 6, wherein said optical device includes one of an optical testing device configured for testing optical property of the microelements, an alignment device configured for positional adjustment of said main pick-up device and a combination thereof.

8. The transfer system as claimed in claim 6, wherein said optical device is co-movable with said main pick-up device.

9. The transfer system as claimed in claim 1, wherein said main pick-up device includes a plurality of pick-up units for releasably picking up the microelements, and a plurality of micro switches, each of which controls a corresponding one of said pick-up units to perform one of picking up and releasing a corresponding one of the microelements.

10. The transfer system as claimed in claim 1, wherein said testing circuit includes at least one integrated circuit that is electrically connected to said testing electrodes.

11. The transfer system as claimed in claim 10, wherein said at least one integrated circuit is one of a MOS circuit, a CMOS circuit and a 3D-IC circuit.

12. The transfer system as claimed in claim 1, wherein said testing electrodes are one of a micro bump array and a micro metal tube array, and each of said testing electrodes has a size ranging from 1 µm to 100 µm.

13. The transfer system as claimed in claim 1, wherein said testing device further includes an electrode plate on which said testing electrodes are disposed, said electrode plate being detachably mounted to said testing platform to achieve electrical connection between said testing electrodes and said testing circuit.

14. The transfer system as claimed in claim 1, wherein in said testing device, a pitch between adjacent two of said testing electrodes ranges from 1 μm to 100 μm.

15. The transfer system as claimed in claim 1, wherein said main pick-up device further includes a CMOS storage circuit layer and an address electrode layer connected to said CMOS storage circuit layer.

16. The transfer system as claimed in claim 1, wherein said main pick-up device picks up the microelements through exertion of an attraction force, the attraction force being one of an electrostatic force, a van der Waals force, a vacuum suction force, an electromagnetic force and an adhesive force.

17. The transfer system as claimed in claim 1, wherein said main pick-up device further includes one of an elastic layer and gecko-mimicking structures, said one of said elastic layer and said gecko-mimicking structures exerting an attraction force to the microelements.

18. The transfer system as claimed in claim 17, wherein said elastic layer is made of polydimethylsiloxane (PDMS).

19. The transfer system as claimed in claim 1, wherein said main pick-up device further includes a releasable adhesive layer for picking up the microelements, said releasable adhesive layer is one of a UV release tape, a thermal release tape, and a water release tape.

20. The transfer system as claimed in claim 1, further comprising a UV lighting device.

* * * * *